United States Patent
Kim et al.

(10) Patent No.: US 10,541,248 B2
(45) Date of Patent: Jan. 21, 2020

(54) SEMICONDUCTOR DEVICE, SYSTEMS AND METHODS OF MANUFACTURE

(71) Applicant: Samsung Electronics Co., Ltd., Suwon-si (KR)

(72) Inventors: Taekyung Kim, Seoul (KR); Kwang Soo Seol, Yongin-si (KR); Seong Soon Cho, Suwon-si (KR); Sunghoi Hur, Seoul (KR); Jintae Kang, Osan-si (KR)

(73) Assignee: SAMSUNG ELECTRONICS CO., LTD., Samsung-ro, Yeongtong-gu, Suwon-si, Gyeonggi-do (JP)

( * ) Notice: Subject to any disclaimer, the term of this patent is extended or adjusted under 35 U.S.C. 154(b) by 0 days.

(21) Appl. No.: 16/045,997

(22) Filed: Jul. 26, 2018

(65) Prior Publication Data

US 2018/0366474 A1 Dec. 20, 2018

Related U.S. Application Data

(63) Continuation of application No. 14/474,867, filed on Sep. 2, 2014, now Pat. No. 10,043,816.

(30) Foreign Application Priority Data

Sep. 2, 2013 (KR) .......................... 10-2013-0105006

(51) Int. Cl.
*H01L 23/528* (2006.01)
*H01L 27/115* (2017.01)
(Continued)

(52) U.S. Cl.
CPC .... *H01L 27/1157* (2013.01); *H01L 27/11519* (2013.01); *H01L 27/11582* (2013.01); *H01L 29/4234* (2013.01); *H01L 29/7926* (2013.01)

(58) Field of Classification Search
CPC .......... H01L 29/66712; H01L 29/7802; H01L 29/66734; H01L 29/7813; H01L 21/823462; H01L 21/823857; H01L 2029/7858; H01L 21/28282; H01L 21/823431; H01L 21/823821;
(Continued)

(56) References Cited

U.S. PATENT DOCUMENTS 7,696,559 B2 * 4/2010 Arai ...................... H01L 27/105
257/315
8,133,784 B2 3/2012 Chung et al.
(Continued)

FOREIGN PATENT DOCUMENTS

CN 102163456 8/2011
CN 102376357 3/2012
(Continued)

*Primary Examiner* — Mary A Wilczewski
*Assistant Examiner* — Tsz K Chiu
(74) *Attorney, Agent, or Firm* — Muir Patent Law, PLLC

(57) ABSTRACT

A semiconductor memory device includes a stack of word lines and insulating patterns. Cell pillars extend vertically through the stack of word lines and insulating patterns with memory cells being formed at the junctions of the cell pillars and the word lines. A ratio of the thickness of the word lines to the thickness of immediately neighboring insulating patterns is different at different locations along one or more of the cell pillars. Related methods of manufacturing and systems are also disclosed.

20 Claims, 34 Drawing Sheets

(51) Int. Cl.
*H01L 27/11556* (2017.01)
*H01L 27/11582* (2017.01)
*H01L 27/1157* (2017.01)
*H01L 29/423* (2006.01)
*H01L 27/11519* (2017.01)
*H01L 29/792* (2006.01)

(58) Field of Classification Search
CPC ............... H01L 21/845; H01L 27/0886; H01L 27/0924; H01L 27/10826; H01L 27/10879; H01L 27/1211; H01L 29/41791; H01L 29/66795; H01L 29/66833; H01L 29/785; H01L 29/792; H01L 2924/13067; H01L 29/4234; H01L 29/518; H01L 29/42324; H01L 29/66825; H01L 29/788; H01L 29/7808; H01L 27/11273; H01L 27/11517; H01L 2924/13081; H01L 2924/13085; H01L 29/6684; H01L 29/78391; H01L 29/4236
See application file for complete search history.

(56) References Cited

U.S. PATENT DOCUMENTS

| | | | |
|---|---|---|---|
| 8,278,170 B2 | 10/2012 | Lee et al. | |
| 8,338,876 B2 | 12/2012 | Kito et al. | |
| 8,344,446 B2 | 1/2013 | Tsuji | |
| 8,564,050 B2 | 10/2013 | Park et al. | |
| 8,654,584 B2 | 2/2014 | Kim et al. | |
| 8,923,053 B2 | 12/2014 | Han et al. | |
| 8,994,091 B2 * | 3/2015 | Lee .................. | H01L 27/11556 257/316 |
| 9,018,682 B2 | 4/2015 | Izumida et al. | |
| 9,099,496 B2 * | 8/2015 | Tian .................. | H01L 29/66825 |
| 9,236,396 B1 * | 1/2016 | Koka ................. | H01L 27/11582 |
| 9,305,849 B1 * | 4/2016 | Tsutsumi .......... | H01L 27/11582 |
| 9,312,008 B2 * | 4/2016 | Nam .................. | G11C 16/0483 |
| 9,406,694 B1 * | 8/2016 | Ikeno ................ | H01L 27/11582 |
| 9,634,024 B2 * | 4/2017 | Kanamori ......... | H01L 27/11582 |
| 9,659,958 B2 * | 5/2017 | Lee .................... | H05K 999/99 |
| 10,276,583 B2 * | 4/2019 | Sharangpani ..... | H01L 27/1157 |
| 10,340,286 B2 * | 7/2019 | Goda ................ | H01L 27/11582 |
| 2010/0019310 A1 | 1/2010 | Sakamoto | |
| 2010/0078701 A1 | 4/2010 | Shim et al. | |
| 2010/0207193 A1 | 8/2010 | Tanaka et al. | |
| 2011/0143524 A1 | 6/2011 | Son et al. | |
| 2011/0199825 A1 | 8/2011 | Han et al. | |
| 2011/0287612 A1 | 11/2011 | Lee et al. | |
| 2012/0012920 A1 | 1/2012 | Shin et al. | |
| 2012/0033501 A1 | 2/2012 | Park et al. | |
| 2012/0098050 A1 | 4/2012 | Shim et al. | |
| 2012/0168848 A1 | 7/2012 | Ahn et al. | |
| 2012/0267701 A1 | 10/2012 | Chae et al. | |
| 2013/0134493 A1 | 5/2013 | Eom et al. | |
| 2015/0001460 A1 | 1/2015 | Kim et al. | |

FOREIGN PATENT DOCUMENTS

| | | |
|---|---|---|
| JP | 2010034112 | 2/2010 |
| JP | 2011170953 | 9/2011 |
| JP | 2011233831 | 11/2011 |
| JP | 2012-109571 A | 6/2012 |
| JP | 2014150236 | 8/2014 |
| JP | 2014241358 | 12/2014 |
| KR | 10-2010-0028827 | 3/2010 |
| KR | 10-2011-0129254 A | 12/2011 |
| KR | 10-2013-0005434 | 1/2013 |

* cited by examiner

PLa

PLb

PLc

PLa

PLb

PLc

SEMICONDUCTOR DEVICE, SYSTEMS AND METHODS OF MANUFACTURE

CROSS-REFERENCE TO RELATED APPLICATION

This U.S. non-provisional patent application is a continuation of and claims priority to U.S. non-provisional patent application Ser. No. 14/474,867 filed on Sep. 2, 2014, which claims priority under 35 U.S.C. § 119 to Korean Patent Application No. 10-2013-0105006, filed on Sep. 2, 2013, in the Korean Intellectual Property Office, the disclosures of each of which are hereby incorporated by reference in their entirety.

BACKGROUND

Semiconductor devices have been more highly integrated in order to provide high performance and low cost thereof. In particular, the integration density of semiconductor devices directly influences the costs of the semiconductor devices. The integration degree of a conventional two-dimensional (2D) memory device is mainly determined by an area that a unit memory cell occupies. Therefore, the integration density of the conventional 2D memory device is greatly affected by the level of a technique for forming fine patterns.

Three-dimensional (3D) semiconductor devices including three-dimensionally arranged memory cells address the above limitations of two-dimensional memory devices. Manufacturing techniques and products that are capable of reducing bit cost and realizing reliable products are desired for successful mass production of the 3D semiconductor devices.

SUMMARY

Embodiments of the inventive concepts may provide semiconductor devices with improved reliability. In some embodiments, a semiconductor device comprises a substrate; a stack comprising a plurality of word lines and insulating patterns vertically stacked on the substrate, corresponding ones of the insulating patterns being sandwiched between neighboring ones of the word lines; and a plurality of cell pillars vertically extending through the stack of the plurality of word lines and insulating patterns, memory cells being formed at junctions of the cell pillars and the word lines. A first portion of the stack may comprise a first word line having a first thickness and a second portion of the stack may comprise a second word line having a second thickness different from the first thickness.

A third portion of the stack may comprise a third word line having a third thickness, wherein the third thickness and the first thickness are less than the second thickness, and wherein the second portion of the stack is interposed between the first portion of the stack and the third portion of the stack.

The second portion of the stack may include the middle of the stack.

The third thickness may be equal to the first thickness.

The ratio of the second thickness to the first thickness may be greater than or equal to 1.1.

The first thickness may be in the range of 35 nm to 42 nm.

The stack comprises an upper select line stacked on the plurality of word lines and insulating patterns and a lower select line interposed between the substrate and the plurality of word lines and insulating patterns.

Each of the memory cells may comprise a nonvolatile memory cell.

Each of the memory cells may comprise a nonvolatile memory transistor.

Each of cell pillars may comprise a conductive core, and wherein each of the memory transistors comprise a charge storage element positioned between the conductive core and a corresponding word line.

The semiconductor device may be a vertical NAND memory device and each cell pillar may form a cell string of the vertical NAND.

Each of the memory cells may comprise a data storage element comprising a material having a variable resistance property.

Each of the memory cells may comprise a data storage element comprising a phase change material.

Each of the memory cells may comprise a data storage element comprising at least one of a ferromagnetic material and an anti-ferromagnetic material.

A diameter of a first cell pillar within the first portion of the stack may be smaller than a diameter of the first cell pillar within the second portion of the stack.

The diameter of the first cell pillar within the first portion of the stack may be less than 42 nm.

A third portion of the stack may comprise a word line having a third thickness. The first thickness and the third thickness may be less than the second thickness, the second portion of the stack may be interposed between the first portion of the stack and the third portion of the stack, and a diameter of a first cell portion within the first portion of the stack may be smaller than a diameter of the first cell pillar within the second portion of the stack.

The second portion of the stack may include the middle of the stack.

A cross section of a first cell pillar within the first portion of the stack may have less striation than a cross section of the first cell pillar within the second portion of the stack.

A third portion of the stack may comprise a third word line having a third thickness, wherein the first thickness and the third thickness are greater than the second thickness, wherein the second portion of the stack is interposed between the first portion of the stack and the third portion of the stack, and wherein a cross section of a first cell pillar within the first portion of the stack has less striation than a cross section of the first cell pillar within the second portion of the stack.

The first portion may comprise a first insulating pattern immediately adjacent to the first word line, the second portion may comprise a second insulating pattern immediately adjacent to the second word line, and a ratio of the second thickness to a thickness of the second insulating pattern is different than a ratio of the first thickness to a thickness of the first insulating pattern.

The second portion may comprise a plurality of second word lines each having the second thickness and a plurality of second insulating patterns each having a same thickness. At least some of the second word lines and second insulating patterns may be located in the middle of the stack.

A ratio of the second thickness to the thickness of the second insulating pattern may be greater than 1.3.

A diameter of a first cell pillar at the first word line is smaller than a diameter of the first cell pillar at the second word line.

In some embodiments, the ratio of the second thickness to the thickness of the second insulating pattern is less than a ratio of the first thickness to a thickness of the first insulating pattern. For example, the ratio of the second thickness to the thickness of the second insulating pattern is less than 1.3. Further, a cross section of a first cell pillar at the first word line has less striation than a cross section of the first cell pillar at the second word line.

In some examples, a semiconductor device comprises a substrate; a stack comprising a plurality of word lines and insulating patterns vertically stacked on the substrate, corresponding ones of the insulating patterns being sandwiched between neighboring ones of the word lines; and a plurality of cell pillars vertically extending through the stack of the plurality of word lines and insulating patterns, memory cells being formed at junctions of the cell pillars and the word lines. A first portion of the stack may comprise a first word line having a first thickness and a first insulating pattern immediately adjacent to the first word line, a second portion of the stack may comprise a second word line having a second thickness a second insulating pattern immediately adjacent to the second word line, and a ratio of the second thickness to the thickness of the second insulating pattern may be different than a ratio of the first thickness to a thickness of the first insulating pattern.

A third portion of the stack may comprise a third word line having a third thickness and a third insulating pattern immediately adjacent the third word line, the second portion of the stack may be interposed between the first portion of the stack and the third portion of the stack, and a ratio of the first thickness to the thickness of the first insulating pattern may be substantially equal to a ratio of the third thickness to a thickness of the third insulating pattern.

The first thickness may be substantially equal to the third thickness.

The first thickness and the third thickness may be less than the second thickness.

The second portion may comprise a plurality of second word lines having the second thickness and a plurality of second insulating patterns having the second thickness, and at least some of the second word lines and second insulating patterns may be located in the middle of the stack.

The ratio of the second thickness to the thickness of the second insulating pattern may be greater than a ratio of the first thickness to a thickness of the first insulating pattern.

A diameter of a first cell pillar at the first word line may be smaller than a diameter of the first cell pillar at the second word line.

The ratio of the second thickness to the thickness of the second insulating pattern is greater than 1.3.

The second word line may be in the middle of the stack.

In some examples, the ratio of the second thickness to the thickness of the second insulating pattern is less than a ratio of the first thickness to a thickness of the first insulating pattern. A cross section of a first cell pillar at the first word line may have less striation than a cross section of the first cell pillar at the second word line. Further, the ratio of the second thickness to the thickness of the second insulating pattern may be less than 1.3.

Methods for manufacturing and systems including the devices described herein are also disclosed.

BRIEF DESCRIPTION OF THE DRAWINGS

The inventive concepts will become more apparent in view of the attached drawings and accompanying detailed description.

FIGS. 5A to 10A, 13A, and 14A are plan views corresponding to FIG. 4A;

FIGS. 5B to 10B, 13B, and 14B are cross-sectional views corresponding to FIG. 4B;

FIGS. 5C to 10C, 13C, and 14C are enlarged views of portions 'B' of FIGS. 5B to 10B, 13B, and 14C, respectively;

DETAILED DESCRIPTION OF THE EMBODIMENTS

Figure 1:
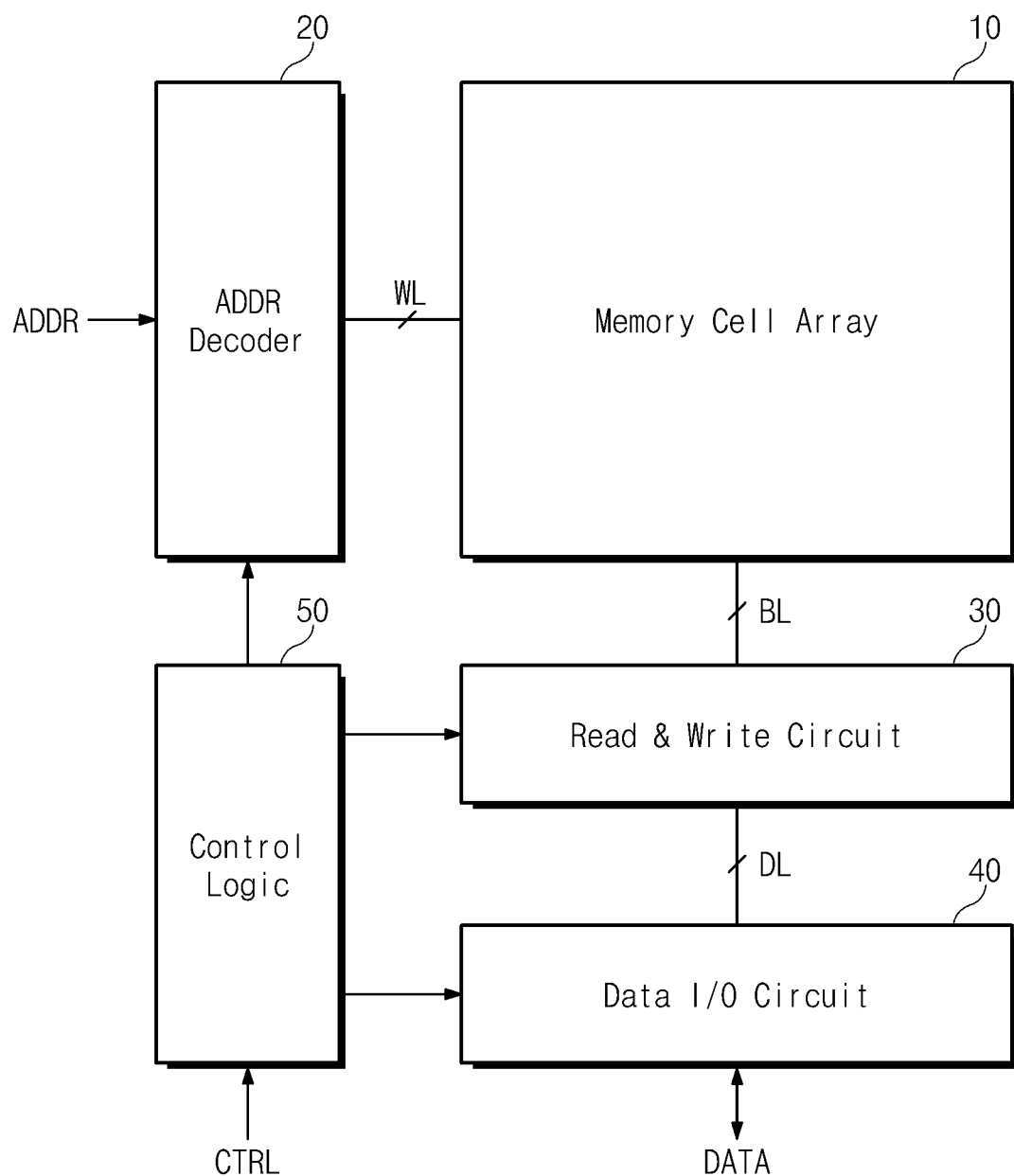
FIG. 1 is a block diagram illustrating a semiconductor device according to some embodiments of the inventive concepts.

The advantages and features of the inventive concepts and methods of achieving them will be apparent from the following exemplary embodiments that will be described in more detail with reference to the accompanying drawings. It should be noted, however, that the present invention is not limited to the following example embodiments, and may be implemented in various forms. These example embodiments are just that—examples—and many implementations and variations are possible that do not require the details provided herein. It should also be emphasized that the disclosure provides details of alternative examples, but such listing of alternatives is not exhaustive. Furthermore, any consistency of detail between various examples should not be interpreted as requiring such detail—it is impracticable to list every possible variation for every feature described herein. The language of the claims should be referenced in determining the requirements of the invention.

In the drawings, the thickness of layers and regions may be exaggerated for clarity. Like numbers refer to like elements throughout. Devices and methods of forming devices according to various embodiments described herein may be embodied in microelectronic devices such as integrated circuits, wherein a plurality of devices according to various embodiments described herein are integrated in the same microelectronic device. Accordingly, cross-sectional view(s) illustrated herein (even if illustrated in a single direction or orientation) may exist in different directions or orientations (which need not be orthogonal or related as set forth in the described embodiments) in the microelectronic device. Thus, a plan view of the microelectronic device that embodies devices according to various embodiments described herein may include a plurality of the devices in an array and/or in a two-dimensional pattern having orientations that may be based on the functionality or other design considerations of the microelectronic device. The cross-sectional view(s) illustrated herein provide support for a plurality of devices according to various embodiments described herein that extend along two different directions in a plan view and/or in three different directions in a perspective view. For example, when a single active region is illustrated in a cross-sectional view of a device/structure, the device/structure may include a plurality of active regions and/or transistor structures (and/or memory cell structures, gate structures, etc., as appropriate to the case) that may have a variety of orientations.

The terminology used herein is for the purpose of describing particular embodiments only and is not intended to limit the invention. As used herein, the singular terms "a," "an" and "the" are intended to include the plural forms as well, unless the context clearly indicates otherwise. As used herein, the term "and/or" includes any and all combinations of one or more of the associated listed items. It will be understood that when an element is referred to as being "connected" or "coupled" to another element, it may be directly connected or coupled to the other element or intervening elements may be present. Other words used to describe the relationship between elements should be interpreted in a like fashion (e.g., "between" versus "directly between," "adjacent" versus "directly adjacent," etc.).

Similarly, it will be understood that when an element such as a layer, region or substrate is referred to as being "on" another element, it can be directly on the other element or intervening elements may be present. In contrast, the term "directly" means that there are no intervening elements. It will be further understood that the terms "comprises," "comprising," "includes" and/or "including," when used herein, specify the presence of stated features, integers, steps, operations, elements, and/or components, but do not preclude the presence or addition of one or more other features, integers, steps, operations, elements, components, and/or groups thereof.

It will be also understood that although the terms first, second, third etc. may be used herein to describe various elements, these elements should not be limited by these terms. These terms are only used to distinguish one element from another element. Thus, a first element in some embodiments (or claims) could be termed (or claimed as) a second element in other embodiments without departing from the teachings of the present invention. Exemplary embodiments of aspects of the present inventive concepts explained and illustrated herein include their complementary counterparts. The same reference numerals or the same reference designators denote the same elements throughout the specification.

Moreover, exemplary embodiments are described herein with reference to cross-sectional illustrations and/or plane illustrations that may be idealized exemplary illustrations. Accordingly, variations from the shapes of the illustrations as a result, for example, of manufacturing techniques and/or tolerances, are to be expected. Thus, exemplary embodiments should not be construed as limited to the shapes of regions illustrated herein but may include deviations in shapes that result, for example, from manufacturing. For example, an etching region illustrated as a rectangle will, typically, have rounded or curved features. Thus, the regions illustrated in the figures are schematic in nature and their shapes may not illustrate the actual shape of a region of a device.

In the specification of the inventive concepts, the concept of an element or feature being "nonmonotonically varied as a height from a substrate increases" refers to the element or feature, such as a size (e.g., a width, a thickness, a space or a diameter, etc.) of an element does not consistently change (e.g., increase or decrease) as a height from a substrate increases. For example, the size of the element may decrease and then increase, or increase and then decrease, or oscillate as a height from a substrate increases.

Spatially relative terms, such as "beneath", "below", "lower", "above", "upper", and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

Unless otherwise defined, all terms (including technical and scientific terms) used herein have the same meaning as commonly understood by one of ordinary skill in the art to which the present inventive concept belongs. It will be further understood that terms, such as those defined in commonly used dictionaries, should be interpreted as having a meaning that is consistent with their meaning in the context of the relevant art and this specification and will not be interpreted in an idealized or overly formal sense unless expressly so defined herein.

Hereinafter, embodiments of the inventive concepts will be described in detail.

FIG. 1 is a block diagram illustrating a semiconductor device according to some embodiments of the inventive concepts. Referring to FIG. 1, a semiconductor device may include a memory cell array 10, an address decoder 20, a read/write circuit 30, a data input/output (I/O) circuit 40, and a control logic circuit 50.

The memory cell array 10 of FIG. 1 is connected to the address decoder 20 through a plurality of word lines WL and connected to the read/write circuit 30 through bit lines BL. The memory cell array 10 includes a plurality of memory cells. For example, each memory cell of the memory cell array 10 may store a bit of data or a plurality of bits of data.

The address decoder 20 of FIG. 1 is connected to the memory cell array 10 through the word lines WL. The address decoder 20 may be operated by the control logic circuit 50. The address decoder 20 may receive address signals ADDR from an external system. The address decoder 20 decodes a row address signal of the received address signals ADDR to select a corresponding word line of the plurality of wore lines WL. Additionally, the address decoder 20 decodes a column address signal of the received address signals ADDR and then transmits the decoded column address signal to the read/write circuit 30. The address decoder 20 may include well-known components such as a row decoder, a column decoder, and an address buffer.

The read/write circuit 30 of FIG. 1 is connected to the memory cell array 10 through the bit lines BL and to the data I/O circuit 40 through data lines DL. The read/write circuit 30 may be operated by the control logic circuit 50. The read/write circuit 30 is configured to receive the decoded column address signal from the address decoder 20. The read/write circuit 30 selects one of the bit lines BL by using the decoded column address. For example, the read/write circuit 30 receives data from the data I/O circuit 40 and writes the received data into the memory cell array 10. The read/write circuit 30 reads data from the memory cell array 10 and transmits the read data to the data I/O circuit 40. The read/write circuit 30 may read data from a first storage region of the memory cell array 10 and may write the read data into a second storage region of the memory cell array 10. For example, the read/write circuit 30 may be configured to perform a copy-back operation.

The read/write circuit 30 may include a page buffer (or a page register) and a column selection circuit. The page buffer may store a page of data corresponding to data to be written to or read from a page of the memory cell array. The page of data may include a m bits of data where m=n×the number of memory cells operatively connected to a word line WL and where n is an integer equal to or greater than one. The read/write circuit 30 may include components including a sense amplifier, a write driver, and a column selection circuit, for example.

The data I/O circuit 40 of FIG. 1 is connected to the read/write circuit 30 through the data lines DL. The data I/O circuit 40 is operated by the control logic circuit 50. The data I/O circuit 40 is configured to exchange data DATA with an external system. The data I/O circuit 40 is configured to transmit data DATA transmitted from the external system to the read/write circuit 30 through the data lines DL. The data I/O circuit 40 is configured to output data DATA transmitted from the read/write circuit 30 to the external system through the data lines DL. For example, the data I/O circuit 40 may include a component such as a data buffer.

The control logic circuit 50 may be connected to the address decoder 20, the read/write circuit 30, and the data I/O circuit 40. The control logic circuit 50 is configured to control operations of the semiconductor device. The control logic circuit 50 may be operated in response to a control signal CTRL transmitted from the external system.

Figure 2:
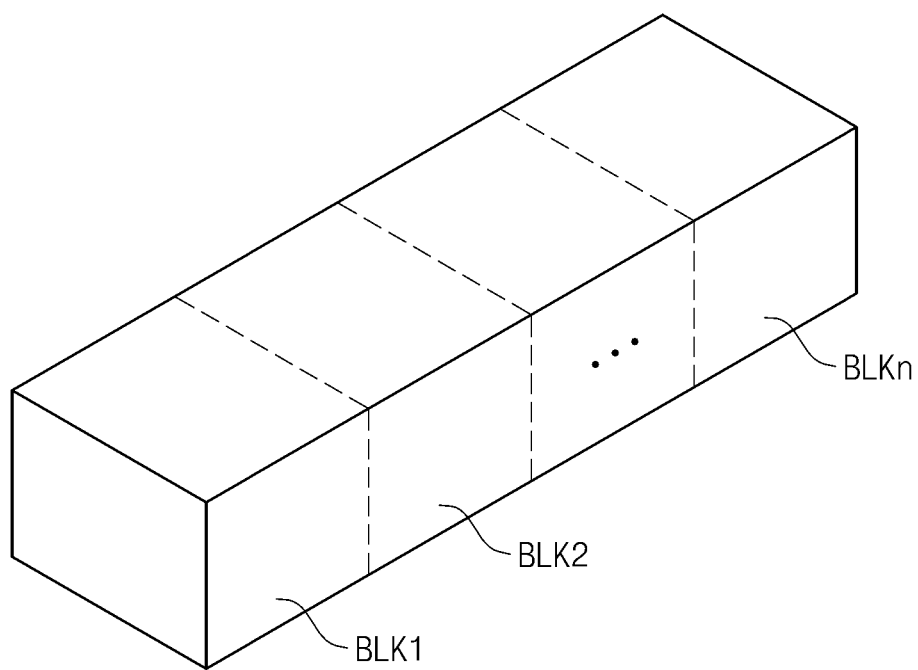
FIG. 2 is a block diagram illustrating an example of a memory cell array of a semiconductor device illustrated in FIG. 1.

FIG. 2 is a block diagram illustrating an example of a memory cell array 10 of a semiconductor device illustrated in FIG. 1. Referring to FIG. 2, the memory cell array 10 of the present example may include a plurality of memory blocks BLK1 to BLKn. Each of the memory blocks BLK1 to BLKn may have a three-dimensional (3D) structure (or a vertical structure). For example, each of the memory blocks BLK1 to BLKn may include a plurality of cell strings extending in a vertical direction.

Figure 3:
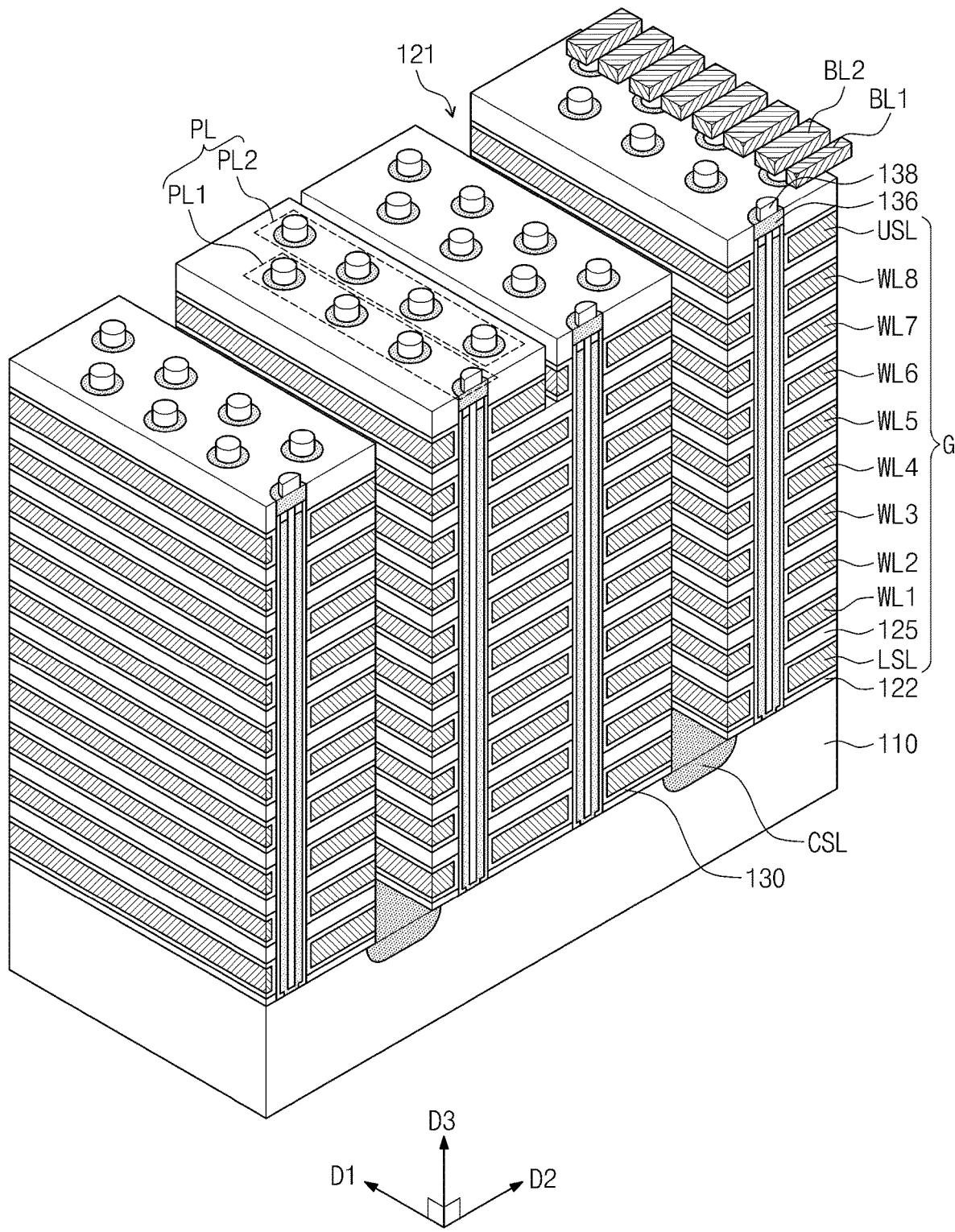
FIG. 3 is a perspective view illustrating a memory block of a semiconductor device according to some embodiments of the inventive concepts.

FIG. 3 is a perspective view illustrating portions of a memory block of a semiconductor device according to some embodiments of the inventive concepts.

Referring to FIG. 3, a substrate 110 is provided. The substrate 110 may have a first conductivity type (e.g., a P-type). A buffer dielectric layer 122 may be provided on the substrate 110. The buffer dielectric layer 122 may be a silicon oxide layer. Insulating patterns 125 and horizontal electrodes may be provided on the buffer dielectric layer 122. The horizontal electrodes may be vertically spaced apart from each other with the insulating patterns 125 therebetween.

The horizontal electrodes may include a lower selection line LSL, first to eighth word lines WL1 to WL8, and an upper selection line USL. The insulating patterns 125 may include silicon oxide. The buffer dielectric layer 122 may be thinner than the insulating patterns 125. The horizontal electrodes may include doped silicon, a metal (e.g., tungsten), a metal nitride (e.g., titanium nitride), a metal silicide, or any combination thereof. In some embodiments, each of the horizontal electrodes may include, for example, a barrier layer and a metal layer on the barrier layer. The barrier layer may include a metal nitride (e.g., titanium nitride), and the metal layer may include, for example, tungsten.

The insulating patterns 125 and the horizontal electrodes may constitute a gate structure G. The gate structure G may horizontally extend along a first direction D1. A plurality of gate structures G may be provided on the substrate 110. The gate structures G may face each other in a second direction D2 that intersects the first direction D1. The upper selection lines USL may be separated from each other in the second direction D2 and may extend in the first direction D1. In FIG. 3, a plurality of upper selection lines USL and one lower selection line LSL are disposed in a single gate structure G. However, the inventive concepts are not limited thereto.

An isolation region 121 extending in the first direction D1 may be provided between the gate structures G that are adjacent to each other. Common source lines CSL are provided in the substrate 110 under the isolation regions 121, respectively. The common source lines CSL may be spaced apart from each other and may extend in the substrate 110 along the first direction D1. The common source lines CSL may have a second conductivity type (e.g., an N-type) different from the first conductivity type. Unlike the embodiment illustrated in FIG. 3, the common source lines CSL may be line-shaped patterns that are provided between the substrate 110 and the lower selection lines LSL and extend in the first direction D1.

A plurality of cell pillars PL may penetrate the horizontal electrodes LSL, WL1 to WL8, and USL and may be connected to the substrate 110. Each of the cell pillars PL may have an axis extending upward from the substrate 110 (e.g., extending in a third direction D3). First ends of the cell pillars PL may be connected to the substrate 110, and second ends of the cell pillars PL may be connected to interconnections extending in the second direction D2. The interconnections may include a first interconnection BL1 and a second interconnection BL2 that are adjacent to each other and extend in the second direction D2.

A plurality of cell pillars PL coupled to a single upper selection line USL may be arranged in a zigzag, a staggered and/or a matrix formation. The plurality of cell pillars PL may include first cell pillars PL1 and second cell pillars PL2 that are coupled to the same upper selection line USL. The first cell pillars PL1 may be nearest to the isolation region 121, and the second cell pillars PL2 may be farther from the isolation region 121 than the first cell pillars PL1. The second cell pillars PL2 may be shifted from the first cell pillars PL1 in the first direction D1 and the second direction D2. Each of the first cell pillars PL1 and each of the second cell pillars PL2 may be respectively connected to the first interconnection BL1 and the second interconnection BL2 through conductive patterns 136 and contacts 138.

A plurality of cell strings may be provided between the interconnections (here, BL1 and BL2) and the common source lines CSL. The interconnections BL1 and BL2 may be bit lines of a flash memory device. One cell string may include an upper selection transistor connected to one of the interconnections BL1 and BL2, a lower selection transistor connected to the common source line CSL, and a plurality of vertical memory cells between the upper and lower selection transistors. The lower selection line LSL may correspond to a lower selection gate of the lower selection transistors. The word lines WL1 to WL8 may correspond to cell gates of the plurality of vertical memory cells (when the vertical memory cells are memory cell transistors, such as NAND flash memory cell transistors). The upper selection line USL may correspond to an upper selection gate of the upper selection transistors. Each cell pillar PL may include a plurality of vertically stacked memory cells. The lower selection gate may be a ground selection gate or a ground select line of the flash memory device. The upper selection gate may be a string selection gate or a string select line of the flash memory device.

A data storage element 130 may be provided between each of the cell pillars PL and each of the word lines WL1 to WL8. In FIG. 3, a data storage element 130 is disposed between corresponding ones of the word lines WL1 to WL8 and the insulating patterns 125 and the cell pillars PL. In some embodiments, at least a portion of the data storage element 130 may extend to be disposed between each of the cell pillars PL and the insulating patterns 125. A gate insulating layer (e.g., instead of a data storage element 130) may be provided between each of the upper and lower selection lines USL and LSL and each of the cell pillars PL. Further description of word lines, bit lines, select lines, common source lines, etc., in NAND flash memory and their operation and function (e.g., for writing, reading or programming) and which may be implemented in the embodiments described herein may be found in U.S. Pat. Nos. 8,514,625 and 5,473,563, both of which are incorporated by reference in their entirety.

Figure 4A:
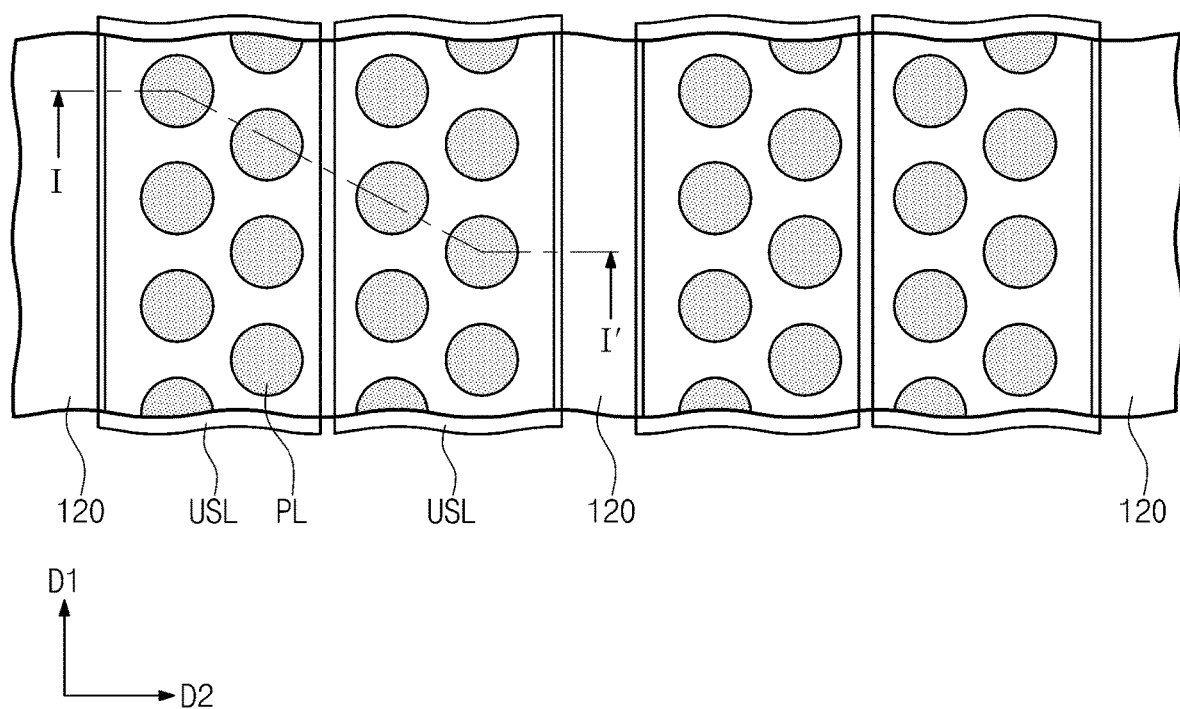
FIG. 4A is a plan view illustrating an embodiment of a memory block of FIG. 3.
Figure 4B:
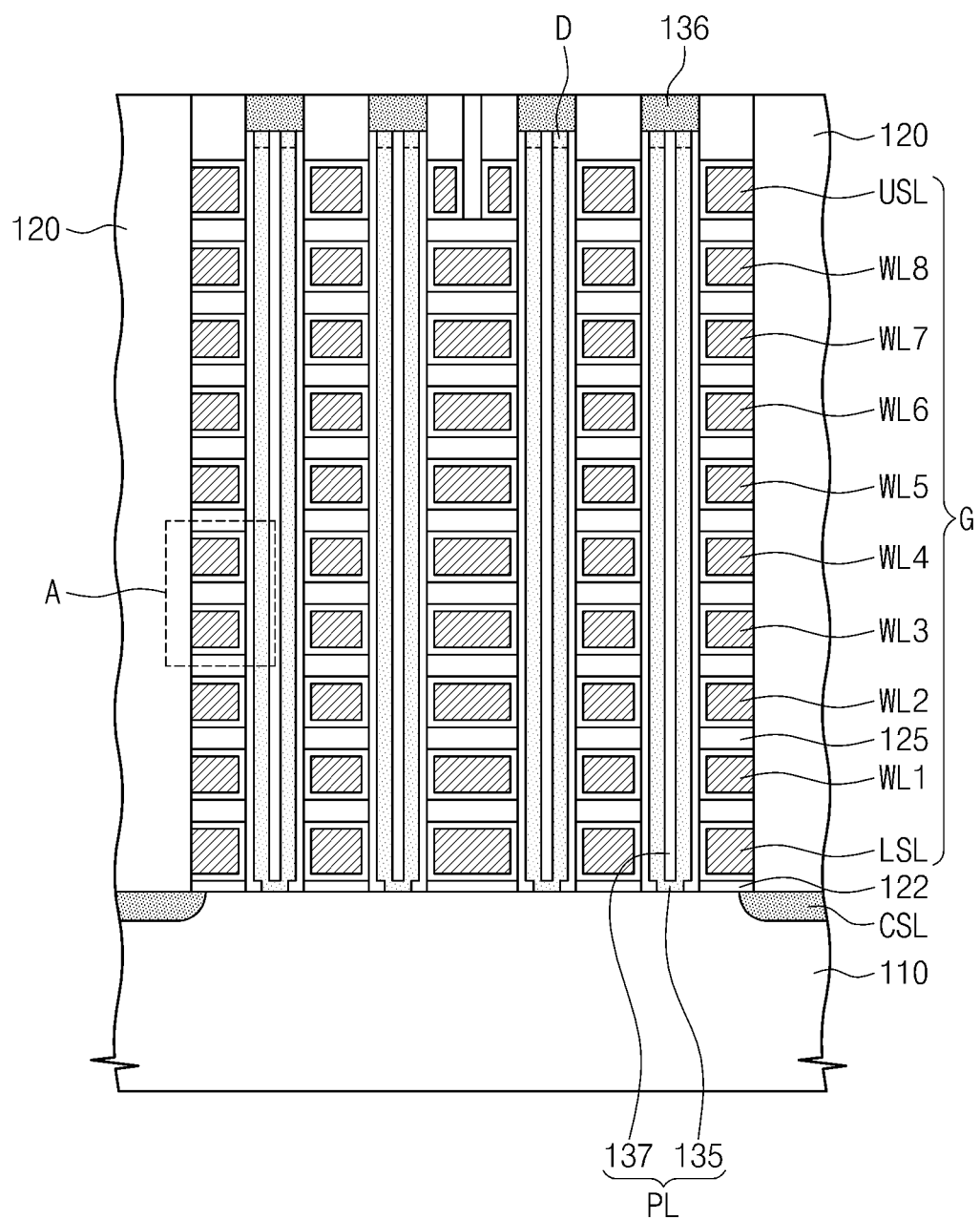
FIG. 4B is a cross-sectional view taken along a line I-I' of FIG. 4A.
Figure 4C:
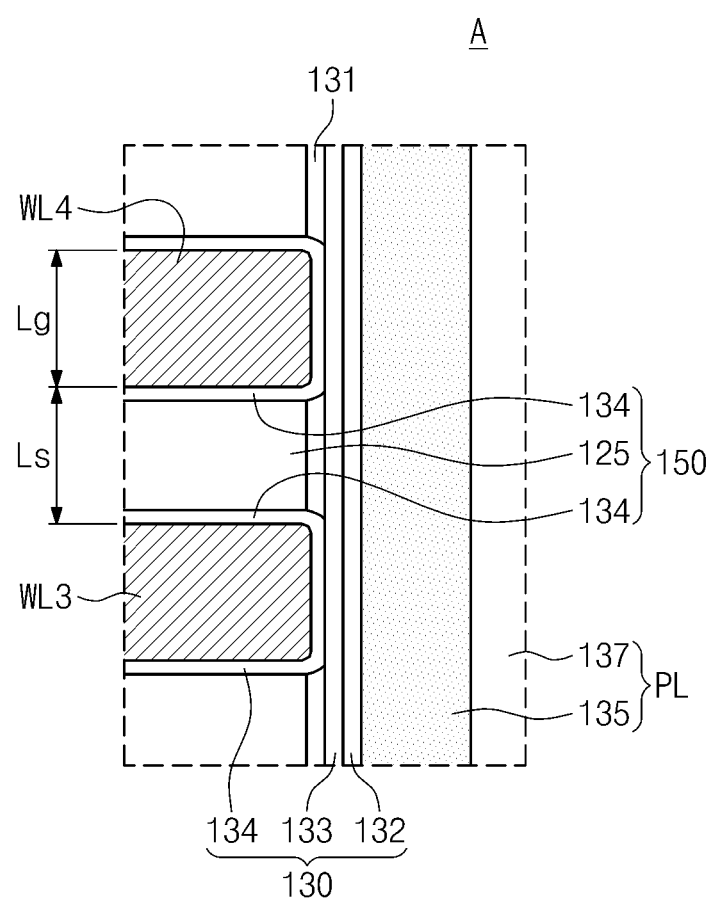
FIG. 4C is an enlarged view of a portion 'A' of FIG. 4B.

FIG. 4A is a plan view illustrating an embodiment of a memory block of FIG. 3, and FIG. 4B is a cross-sectional view taken along a line I-I' of FIG. 4A. FIG. 4C is an enlarged view of a portion 'A' of FIG. 4B. In FIG. 4A, the data storage element is not illustrated for the purpose of simplifying the drawing.

Referring to FIGS. 4A, 4B, and 4C, the isolation region 121 may be filled with an isolation insulating layer 120. The isolation insulating layer 120 may be a silicon oxide layer.

The cell pillars PL may be semiconductor pillars. Each of the cell pillars PL may have a solid cylinder-shape or a hollow cylinder-shape (e.g., a macaroni-shape or tubular configuration). An inner region of the cell pillar PL having the tubular-shape may be filled with a filling insulating layer 137. The filling insulating layer 137 may be formed of a silicon oxide layer. The conductive pattern 136 may be provided on one end of each of the cell pillars PL. A drain region D may be provided in one end portion of the cell pillar PL that is in contact with the conductive pattern 136.

Figure 15A:
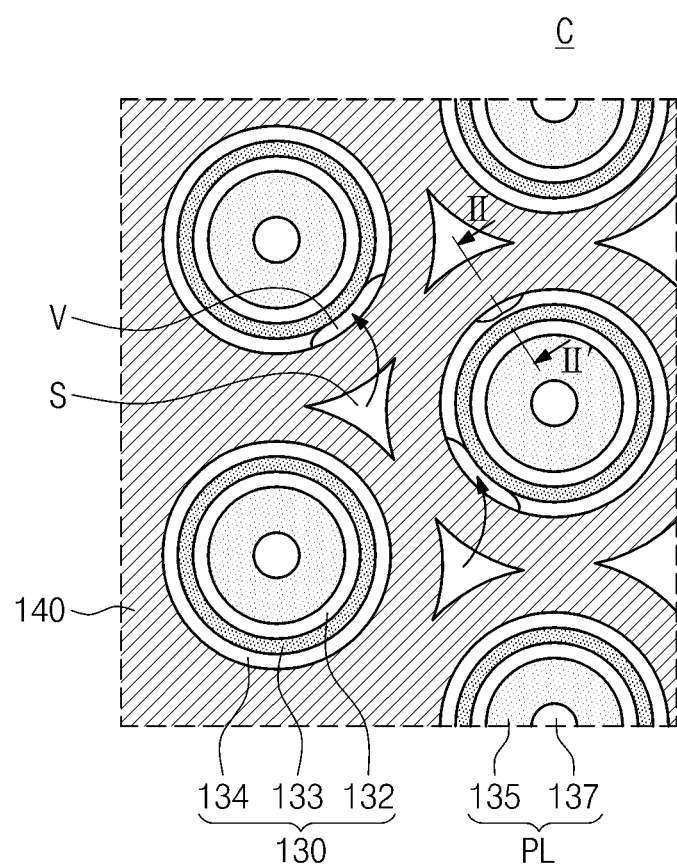
FIG. 15A is an enlarged view of a portion 'C' of FIG. 14A.
Figure 15B:
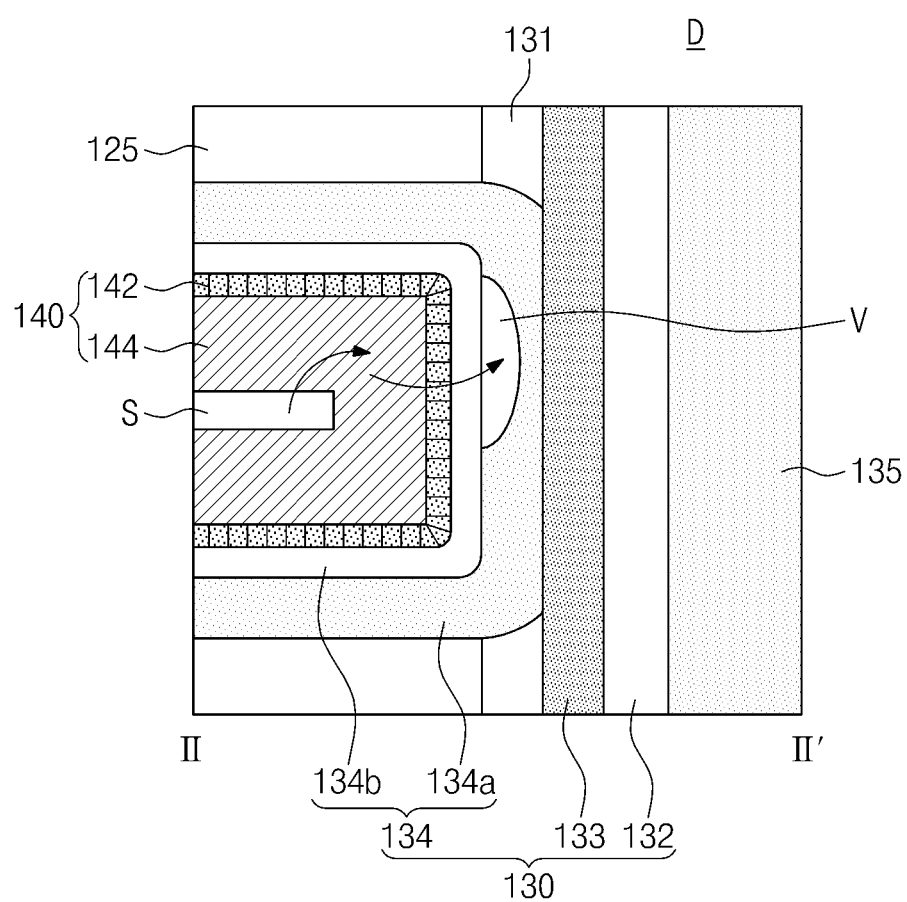
FIG. 15B is an enlarged view of a portion 'D' of FIG. 14C and is a cross-sectional view taken along a line II-IF of FIG. 15A.

The data storage element 130 may include a tunnel insulating layer 132 adjacent to each of the cell pillars PL, a blocking insulating layer 134 adjacent to each of the word lines WL1 to WL8, and a charge storage layer 133 between the tunnel insulating layer 132 and the blocking insulating layer 134, as illustrated in FIG. 4C. The tunnel insulating layer 132 may include a silicon oxide layer. The blocking insulating layer 134 may include a high-k dielectric layer (e.g., an aluminum oxide layer or a hafnium oxide layer). The blocking insulating layer 134 may be a multi-layer consisting of a plurality of thin layers. For example, the blocking insulating layer 134 may include a silicon oxide layer, an aluminum oxide layer, and/or a hafnium oxide layer. As illustrated in FIG. 15B, the blocking insulating layer 134 may include, for example, a silicon oxide layer 134a and a high-k dielectric layer 134b that are sequentially stacked. The charge storage layer 133 may be a charge trap layer, or an insulating layer including conductive nano particles. The charge trap layer may include, for example, a silicon nitride layer.

At least a portion of the data storage element 130 may extend to be disposed between each of the word lines WL1 to WL8 and the insulating patterns 125. Another portion of the data storage element 130 may extend to be disposed between each of the cell pillars PL and the insulating patterns 125. For example, the blocking insulating layer 134 may be disposed between each of the word lines WL1 to WL8 and the insulating patterns 125 in FIG. 4C. For example, the tunnel insulating layer 132 and the charge storage layer 133 may be disposed between each of the cell pillars PL and the insulating patterns 125 in FIG. 4C.

A protection layer 131 may be provided between the charge storage layer 133 and each of the insulating patterns 125. The protection layer 131 may be a silicon oxide layer.

According to the inventive concepts, a thickness Lg of each of the word lines WL1 to WL8 may correspond to a length of each of the cell gates. An intergate dielectric layer 150 may be provided between neighboring word lines WL1 to WL8. The intergate dielectric layers 150 and the word lines WL1 to WL8 may be alternately stacked. Each of the intergate dielectric layers 150 includes one of the insulating patterns 125. Each of the intergate dielectric layers 150 may also include a pair of the blocking insulating layers 134 in FIG. 4C. A thickness of one of the intergate dielectric layers 150 corresponds to a space Ls between neighboring word lines WL. A pitch of the vertical memory cells may be a sum of the thickness Lg and the space Ls.

According to some embodiments of the inventive concepts, the thickness Lg of each of the word lines WL1 to WL8 is greater than the space Ls between the word lines (i.e., the thickness of the intergate dielectric layer 150). A ratio of the thickness Lg to the space Ls (Lg/Ls) may be in the range of about 1.0 to about 1.4. In particular, the ratio of the thickness Lg to the space Ls (Lg/Ls) may be in the range of about 1.2 to 1.4. For example, the thickness Lg of each of the word lines WL1 to WL8 may be equal to or greater than about 35 nm. For example, the smallest thickness of the thicknesses of word lines WL1 to WL8 may be less than 42 nm, such as in the range of 35 nm to 42 nm. The thickness (i.e. Ls) of each of the intergate dielectric layers 150 may be equal to or greater than 27 nm.

A method of manufacturing a semiconductor device according to some embodiments of the inventive concepts will be described hereinafter. FIGS. 5A to 10A, 13A, and 14A are plan views corresponding to FIG. 4A. FIGS. 5B to 10B, 13B, and 14B are cross-sectional views corresponding to FIG. 4B. FIGS. 5C to 10C, 13C, and 14C are enlarged views of portions 'B' of FIGS. 5B to 10B, 13B, and 14C, respectively. FIG. 15A is an enlarged view of a portion 'C' of FIG. 14A. FIG. 15B is an enlarged view of a portion 'D' of FIG. 14C and is a cross-sectional view taken along a line II-IF of FIG. 15A.

Figure 5A:
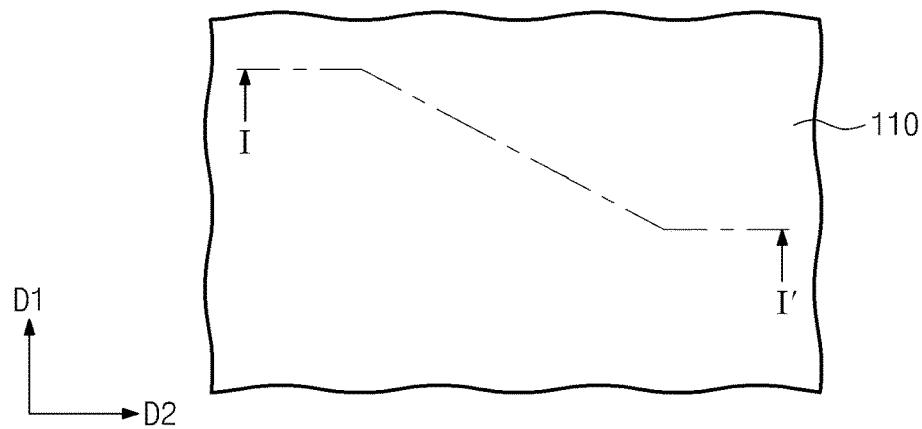
Figure 5B:
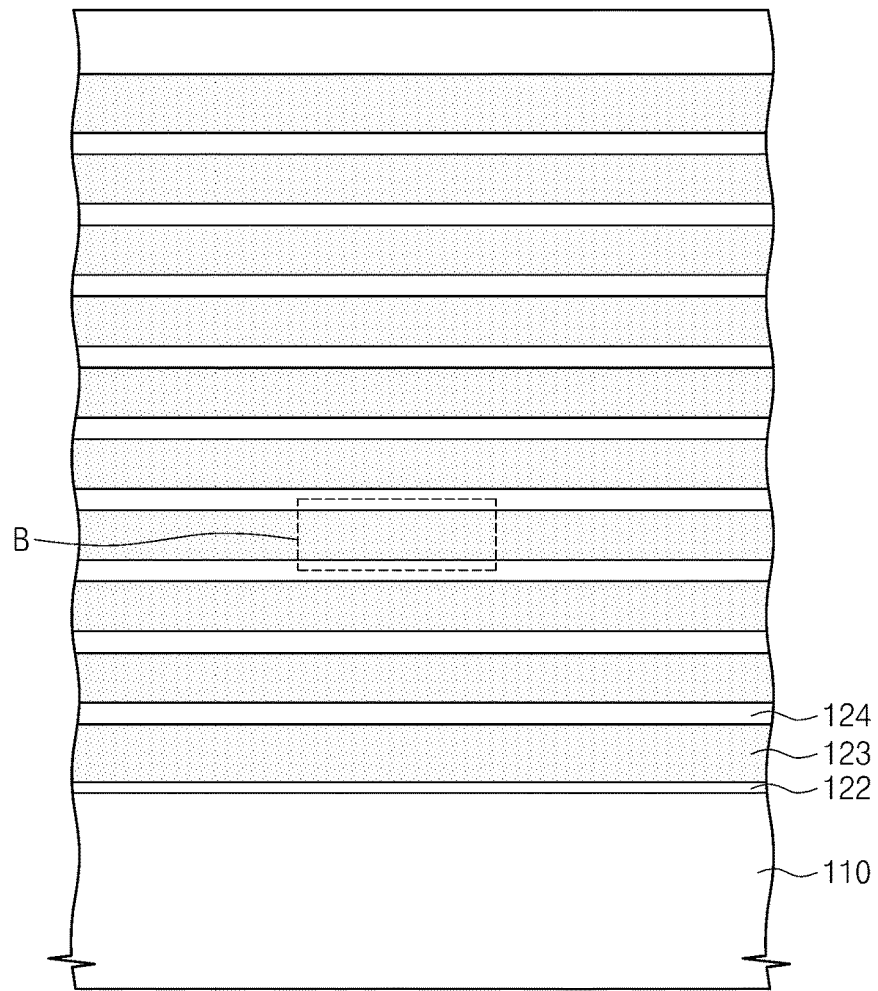
Figure 5C:
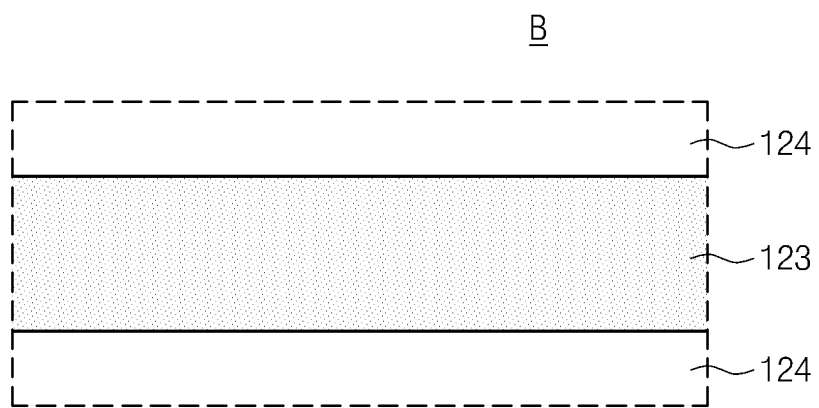

Referring to FIGS. 5A to 5C, a substrate 110 is provided. The substrate 110 may have a first conductivity type (e.g., a P-type). A buffer dielectric layer 122 may be formed on the substrate 110. The buffer dielectric layer 122 may be, for example, a silicon oxide layer. The buffer dielectric layer 122 may be formed by, for example, a thermal oxidation process. Sacrificial layers 123 and insulating layers 124 may be provided to be alternately stacked on the buffer dielectric layer 122. A thickness of an uppermost insulating layer may be greater than those of other insulating layers. The insulating layers 124 may be, for example, silicon oxide layers. The sacrificial layers 123 may include a material having a wet etching property different from those of the buffer dielectric layer 122 and the insulating layers 124. For example, each of the sacrificial layers 123 may include a silicon nitride layer, a silicon oxynitride layer, a poly-silicon layer, or a poly-silicon-germanium layer. The sacrificial layers 123 and the insulating layers 124 may be formed by, for example, chemical vapor deposition (CVD) method.

Thicknesses of the sacrificial and insulating layers 123 and 124 and a ratio of the thicknesses of the layers 123 and 124 may obtain the thickness Lg of the word lines WL1 to WL8 and the space Ls between the word lines WL1 to WL8 as described with reference to FIG. 4C.

Figure 6A:
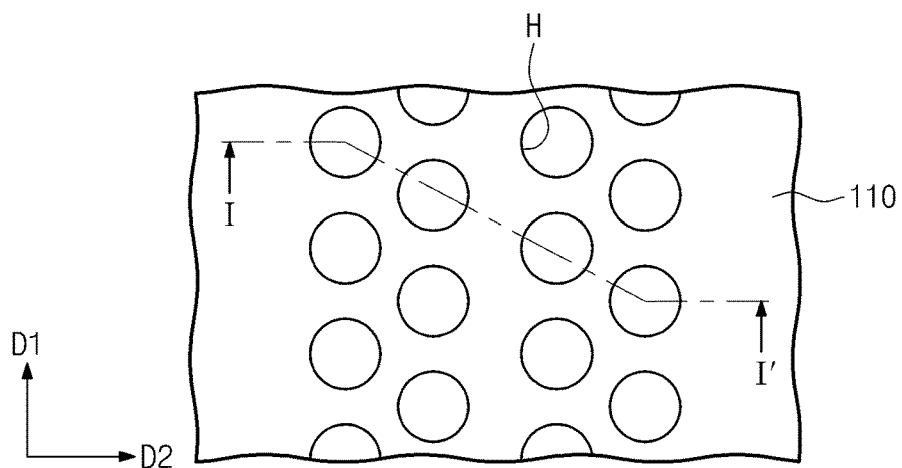
Figure 6B:
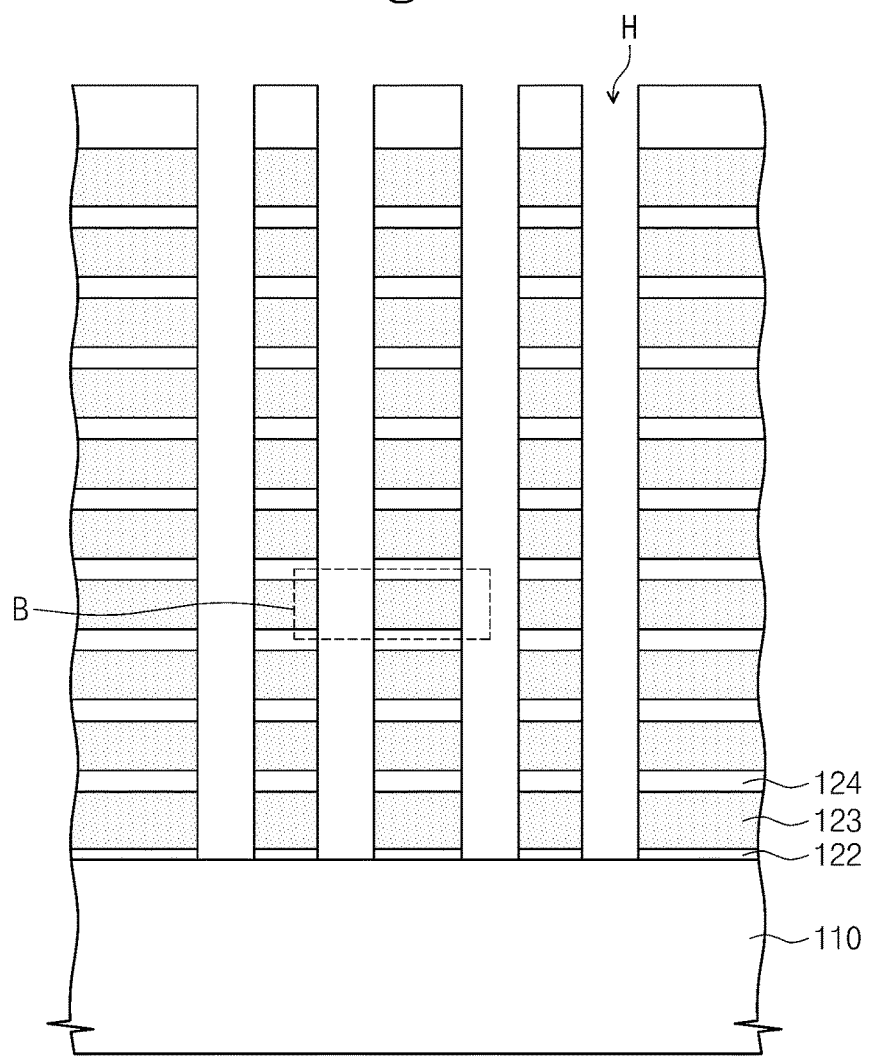
Figure 6C:
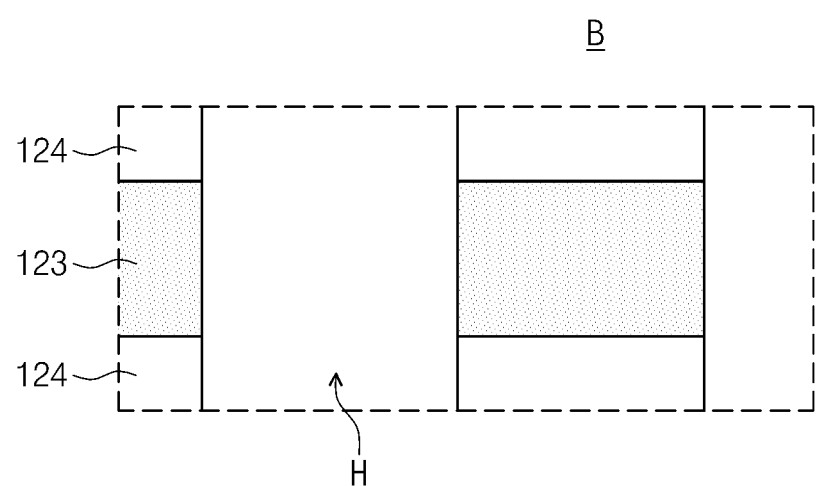

Referring to FIGS. 6A to 6C, cell holes H are formed to penetrate the insulating layers 124, the sacrificial layers 123 and the buffer dielectric layer 122. The cell holes H expose the substrate 110.

Referring to FIGS. 7A to 7C and 8A to 8C, cell pillars PL are formed in the cell holes H, respectively. The formation process of the cell pillars PL will be described in more detail.

Figure 7A:
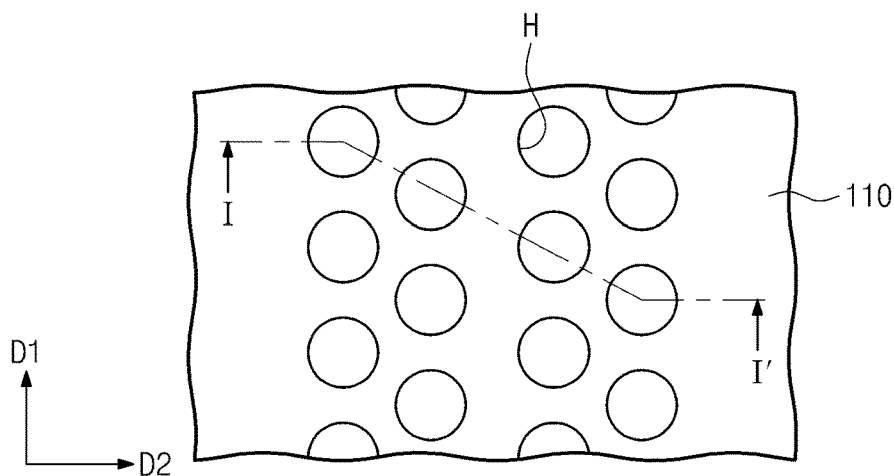
Figure 7B:
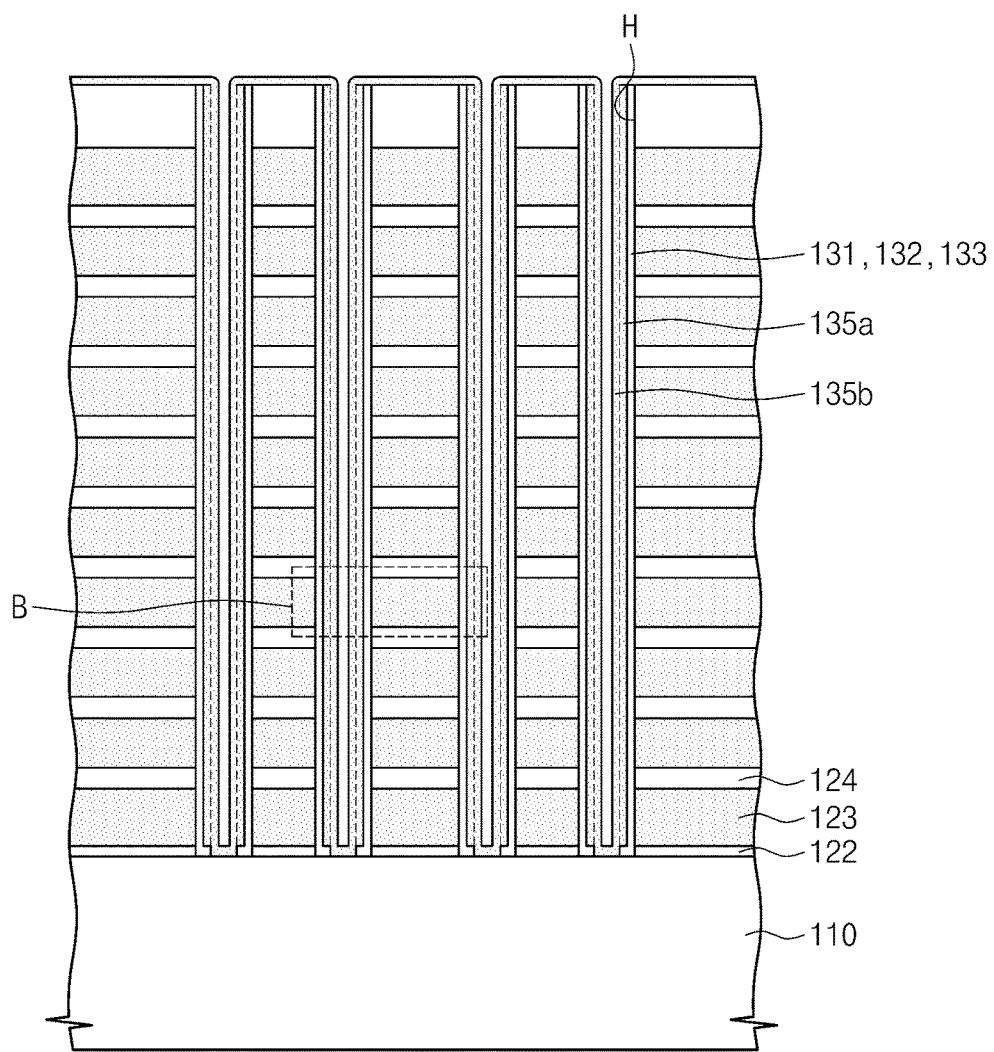
Figure 7C:
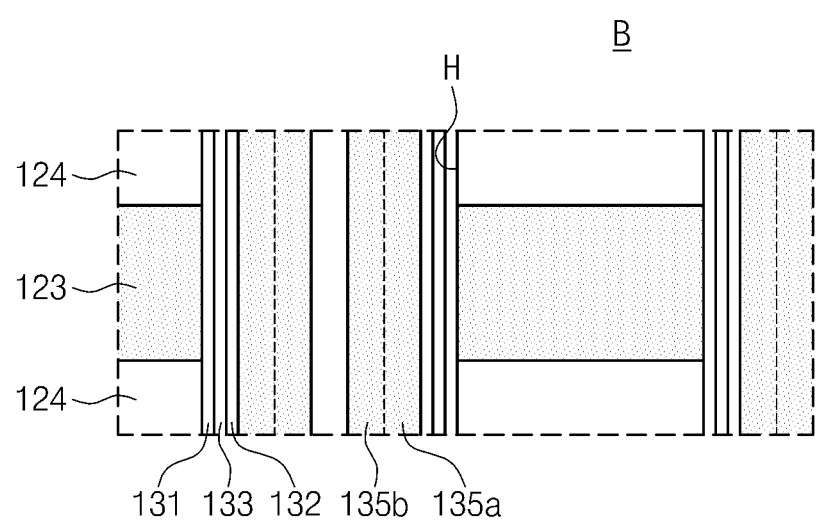

Referring to FIGS. 7A to 7C, a protection layer 131 is formed on sidewalls of the cell holes H. The protection layer 131 may be a silicon oxide layer. A charge storage layer 133 is formed on the protection layer 131. The charge storage layer 133 may be a charge trap layer, or an insulating layer including conductive nano-particles. For example, the charge trap layer may include a silicon nitride layer. A tunnel insulating layer 132 is formed on the charge storage layer 133. The tunnel insulating layer 132 may be a silicon oxide layer. The protection layer 132, the tunnel insulating layer 132, and the charge storage layer 133 may be formed by an atomic layer deposition (ALD) method or a CVD method.

A first sub-semiconductor layer 135a may be formed on the tunnel insulating layer 132. The first sub-semiconductor layer 135a is anisotropically etched to expose the substrate 110. Thus, the first sub-insulating layer 135a may be converted into a spacer on the inner sidewall of the tunnel insulating layer 132. A second sub-semiconductor layer 135b may be formed on the first sub-semiconductor layer 135a. The second sub-semiconductor layer 135b may contact with the substrate 110. Each of the first and second sub-semiconductor layers 135a and 135b may be formed by an ALD method or a CVD method. Each of the first and second sub-semiconductor layers 135a and 135b may be an amorphous silicon layer.

Figure 8A:
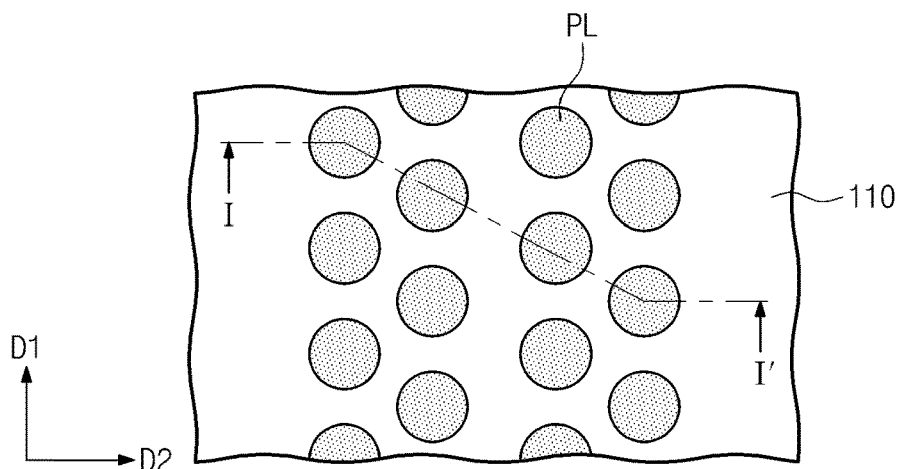
Figure 8B:
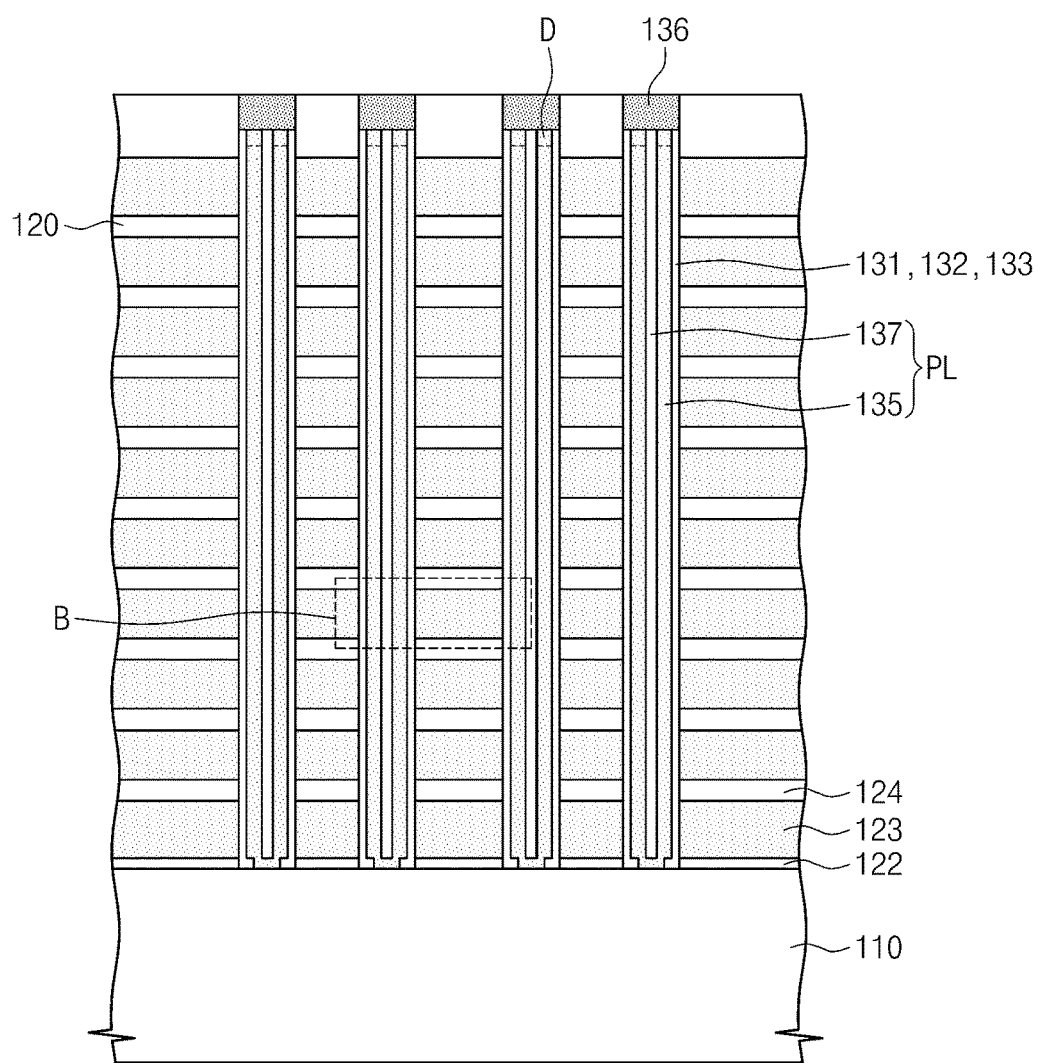
Figure 8C:
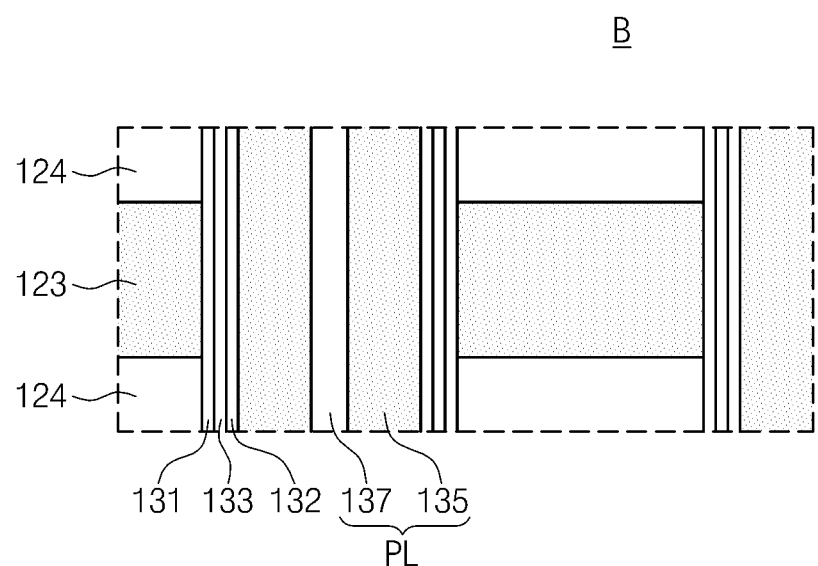

Referring to FIGS. 8A to 8C, a thermal treatment process may be performed to convert the first and second sub-semiconductor layers 135a and 135b into a semiconductor layer 135. The semiconductor layer 135 may be a polycrystalline silicon layer or a single-crystalline layer.

The semiconductor layer 135 may be formed to partially fill the cell holes H, forming a tubular structure within the cell holes H. An insulating material 137 may be formed within the tubular semiconductor layer 135 to completely fill the cell holes H. The insulating material 137 and the semiconductor layer 135 may be planarized to expose the uppermost insulating layer. Thus, cell pillars PL having a hollow cylindrical shape filled with a filling insulating layer 137 may be formed in the cell holes H, respectively. The cell pillars PL may be a semiconductor layer having the first conductivity type. Unlike the embodiment illustrated in the drawings, the semiconductor layer 135 may be formed to fill the cell holes H. In this case, the filling insulating layer may be omitted.

Top end portions of the cell pillars PL may be recessed to be lower than a top surface of the uppermost one of insulating layers 124. Conductive patterns 136 may be formed in the cell holes H having the recessed cell pillars PL, respectively. The conductive patterns 136 may include a doped poly-silicon or a metal. Dopant ions of a second conductivity type may be implanted into the conductive patterns 136 and upper portions of the recessed cell pillars PL, thereby forming drain regions D. For example, the second conductivity type may be an N-type.

Figure 9A:
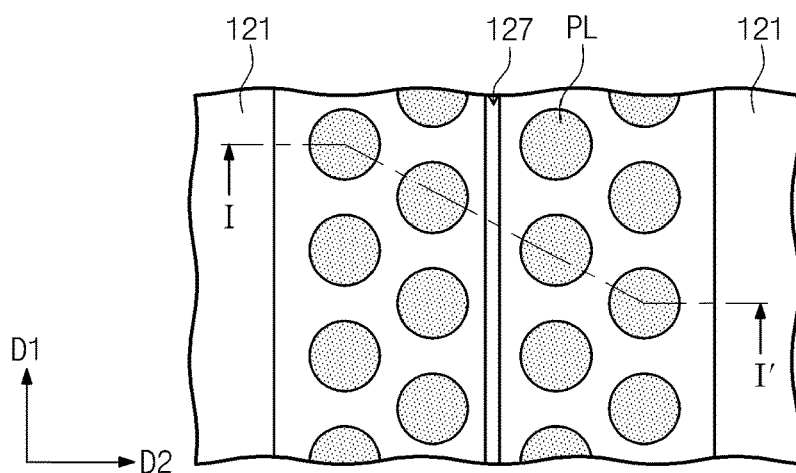
Figure 9B:
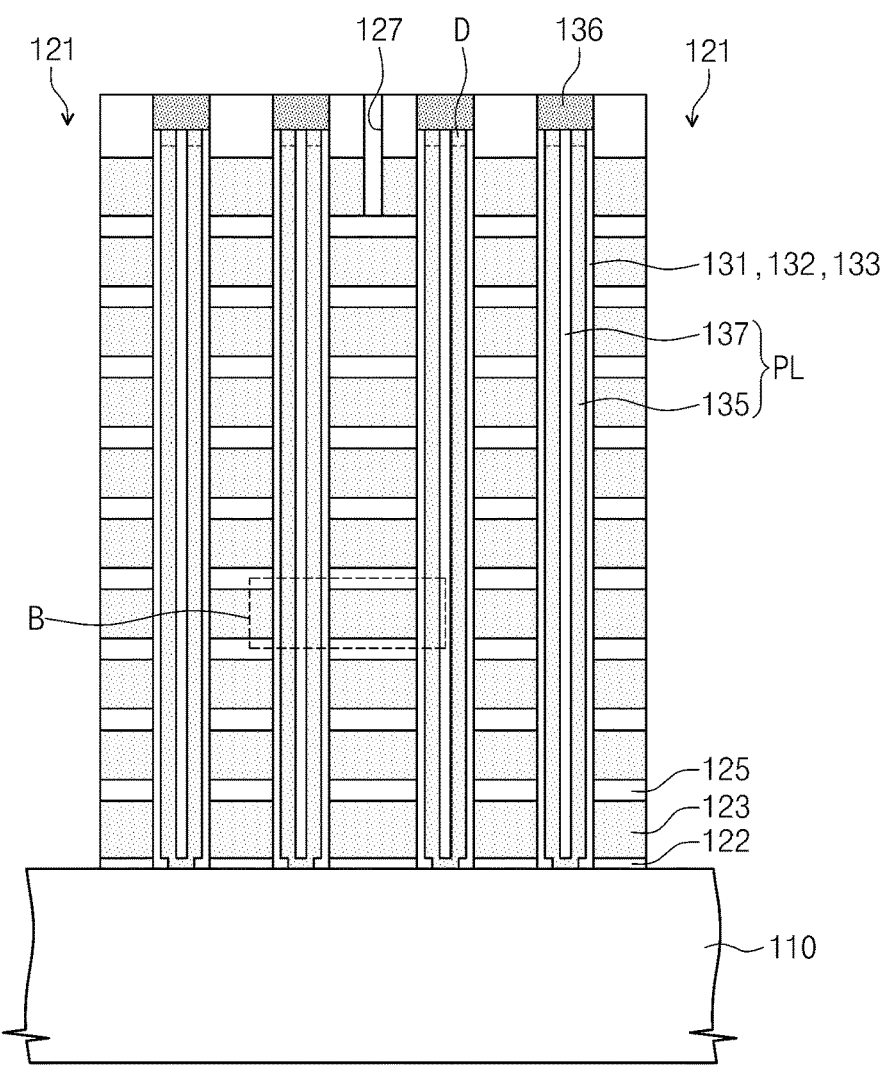
Figure 9C:
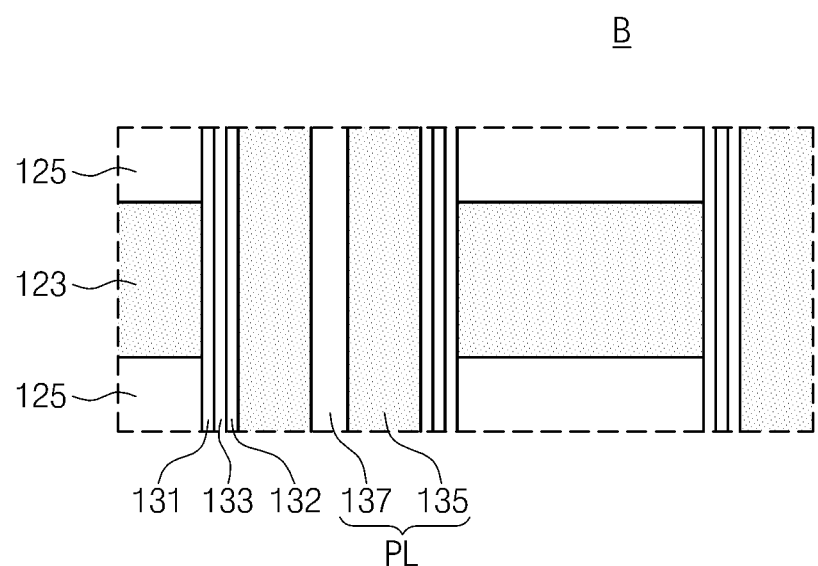

Referring to FIGS. 9A to 9C, the insulating layer 124, the sacrificial layers 123, and the buffer dielectric layer 122 are successively patterned to form isolation regions 121 spaced apart from each other. The isolation regions 121 extend in a first direction D1 and expose the substrate 110. The thus patterned insulating layers 124 correspond to insulating patterns 125. Before or after the isolation regions 121 are formed, the uppermost one of insulating layers 124/125 and an uppermost one of the sacrificial layers 123 may be patterned to form an opening 127. The opening 127 may be disposed between the isolation patterns 121. The opening 127 may extend between the isolation patterns 121 in the first direction D1, thereby dividing the uppermost sacrificial layer into two segments. An insulating layer (e.g., a silicon oxide layer) may fill the opening 127.

Figure 10A:
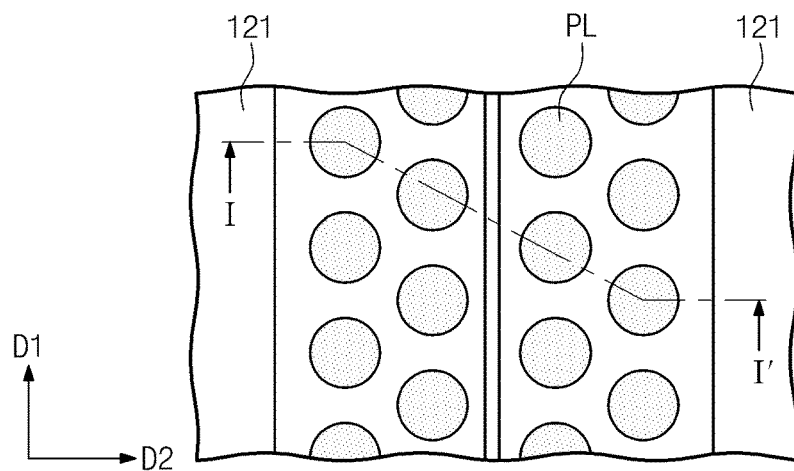
Figure 10B:
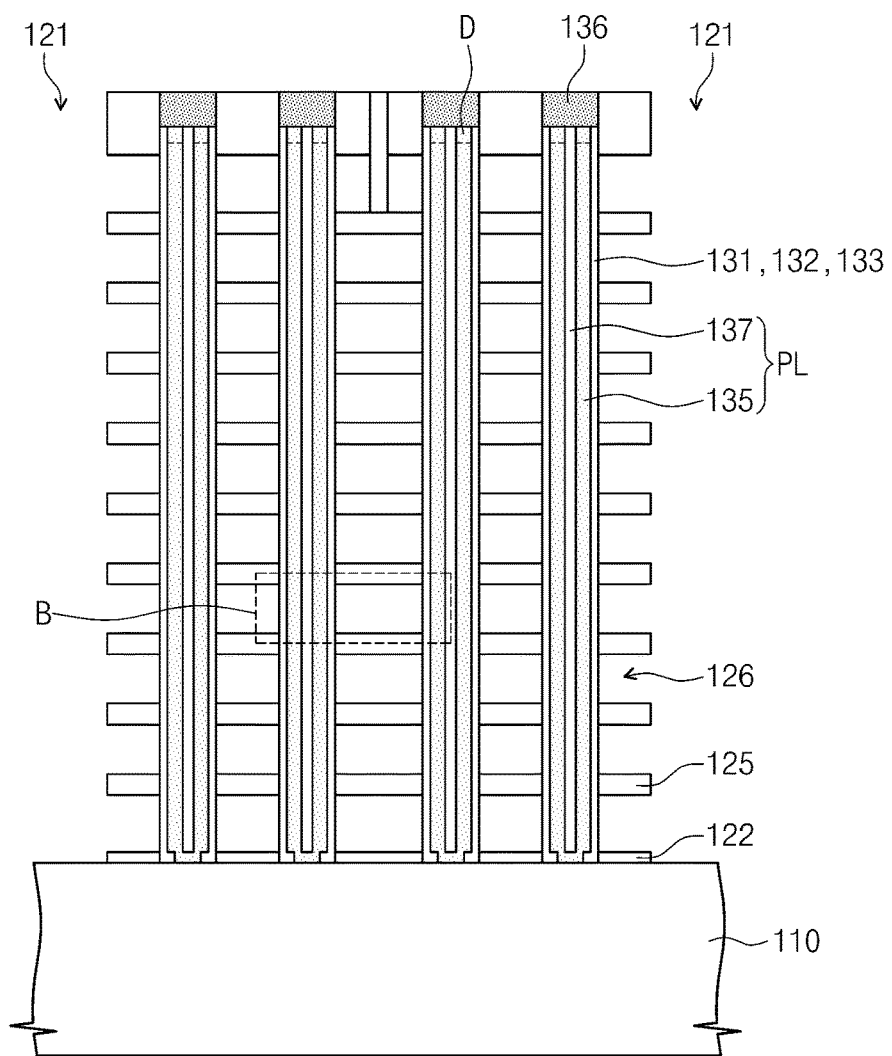
Figure 10C:
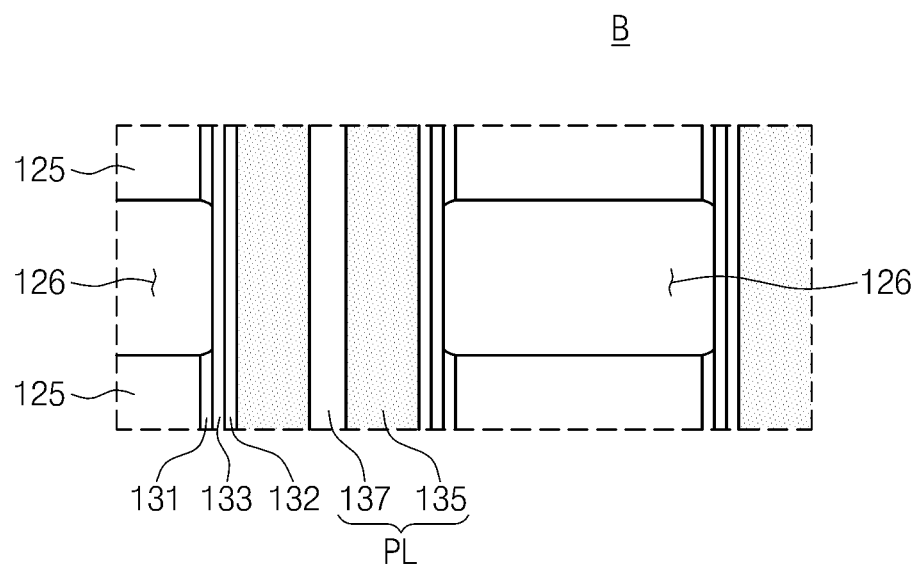

Referring to FIGS. 10A to 10C, the sacrificial layers 123 exposed by the isolation regions 121 are selectively removed to form recess regions 126. The recess regions 126 correspond to regions where the sacrificial layers 123 are removed. The recess regions 126 are defined by the cell pillars PL and the insulating patterns 126. If the sacrificial layers 123 include silicon nitride layers or silicon oxynitride layers, the removal process of the sacrificial layers 123 may be performed using an etching solution including phosphoric acid. Portions of the protection layer 131 on sidewalls of the cell pillars PL may be exposed by the recess regions 126.

The protection layer 131 may prevent the charge storage layer 133 from being damaged by the etching solution that removes the sacrificial layers 123. The protection layer 131 exposed by the recess regions 126 may be selectively removed. If the protection layer 131 is a silicon oxide layer, the protection layer 131 may be removed by, for example, an etching solution including hydrofluoric acid. Thus, the recess regions 126 may expose portions of the charge storage layer 133.

It is desired that a total height of a stack of the sacrificial layers 123 and the insulating layer 124 is reduced in order to easily form the cell holes H described above. Thus, an aspect ratio of the cell holes H may be reduced to better etch the stack of the sacrificial layers 123 and the insulating layer 124. Reduction of the thicknesses of the sacrificial layers 123 and/or the insulating layers 124 may reduce the total height of the stack without reduction of the number of stacked layers.

The reduction of the thickness of the sacrificial layers 123 may cause reduction of the thickness Lg of each of the word lines WL1 to WL8 described with reference to FIG. 4C. Thus, the length of the gate corresponding to the thickness Lg of each of the word lines WL1 to WL8 may be reduced to increase resistance of the word lines WL1 to WL8. Additionally, the reduction of the thickness of the sacrificial layers 123 may cause various problems in a process of filling the recess regions 126 with a conductive layer 140. (See FIGS. 13A to 13C and 14A to 14C)

Figure 11:
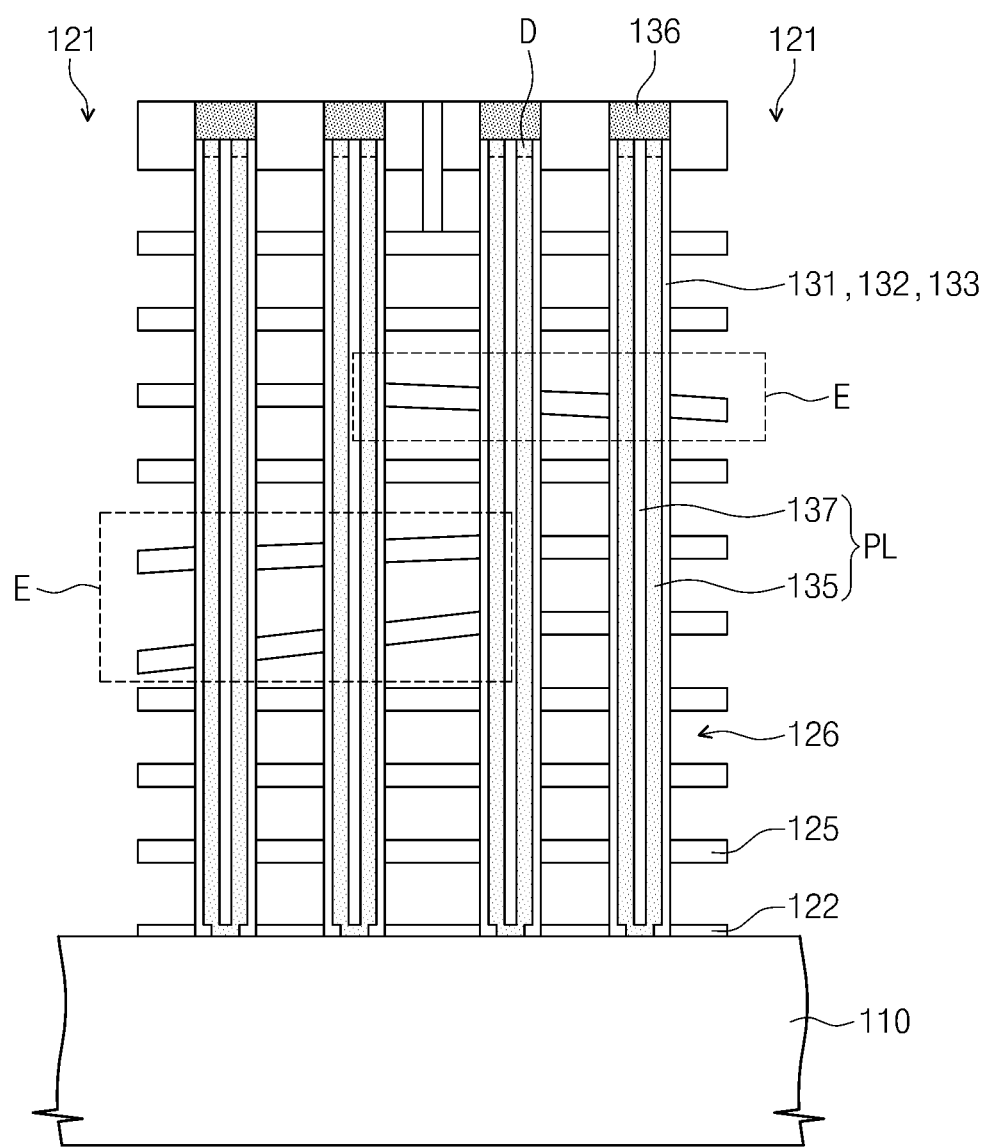
FIG. 11 is a cross-sectional view corresponding to FIG. 10B.

The reduction of the thickness of the insulating layers 124 may cause reduction of the space Ls between the word lines WL1 to WL8 described with reference to FIG. 4C. If the space Ls between the word lines WL1 to WL8 is reduced too much, the insulating layer 124 may not endure a WL voltage applied between the word lines WL1 to WL8. If the insulating layer 124 is too thin, a breakdown phenomenon may occur in the insulating layer 124 by the WL voltage (for example, about 15V). Thus, if the space Ls between the word lines WL1 to WL8 is too narrow, interference and/or a leakage current may occur between the word lines WL1 to WL8 such that errors may occur in read and/or write operations of the memory cell. Additionally, the insulating layers 124 may be deformed by a mechanical stress caused due to a capillary effect in the removal process of the sacrificial layers 123. (See a reference designator E of FIG. 11) This phenomenon may cause defects and/or weakness of the memory cells.

Figure 12:
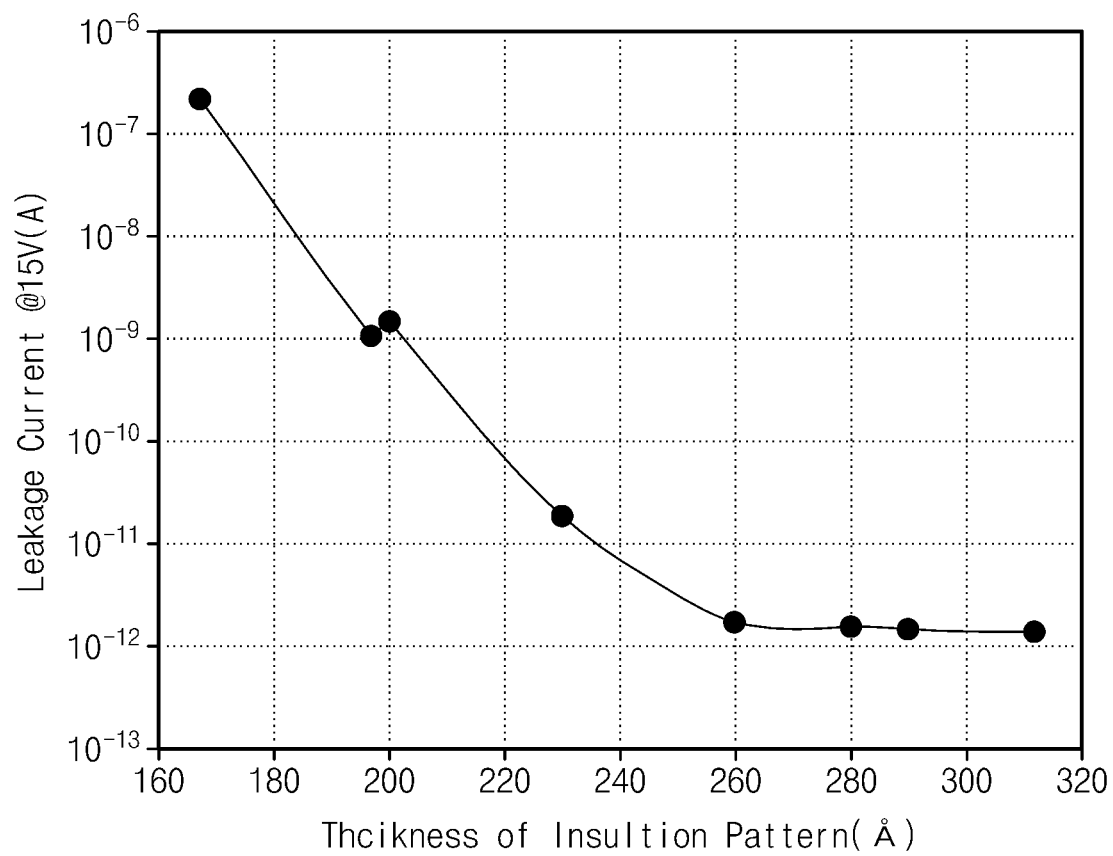
FIG. 12 is a graph illustrating a leakage current between word lines according to a thickness of an insulating pattern.

Thus, the thickness of the sacrificial layers 123 and/or the thickness of the insulating layers 124 should be suitably adjusted in the process illustrated in FIGS. 5A to 5C. The total height of the stack of the sacrificial layers 123 and the insulating layers 124 should be reduced but the thickness of the sacrificial layers 123 and/or the insulating layers 124 have a lower limitation. As illustrated in FIG. 12, when the thickness of the insulating layer 124 is equal to or greater than about 26 nm, the leakage current is relatively small.

Figure 13A:
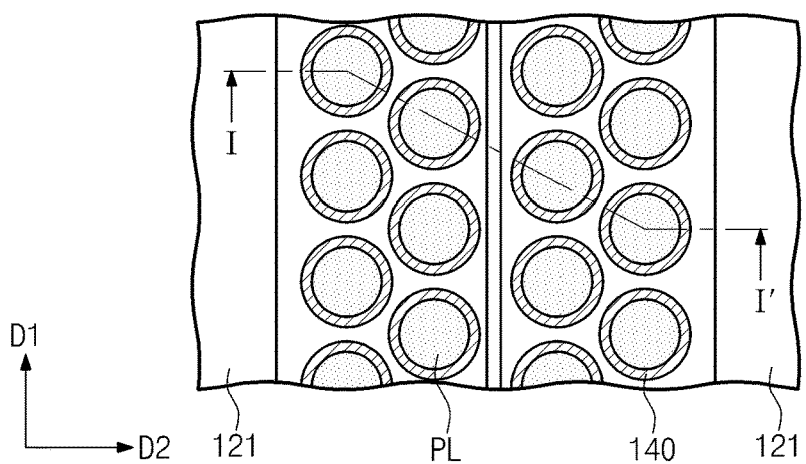
Figure 13B:
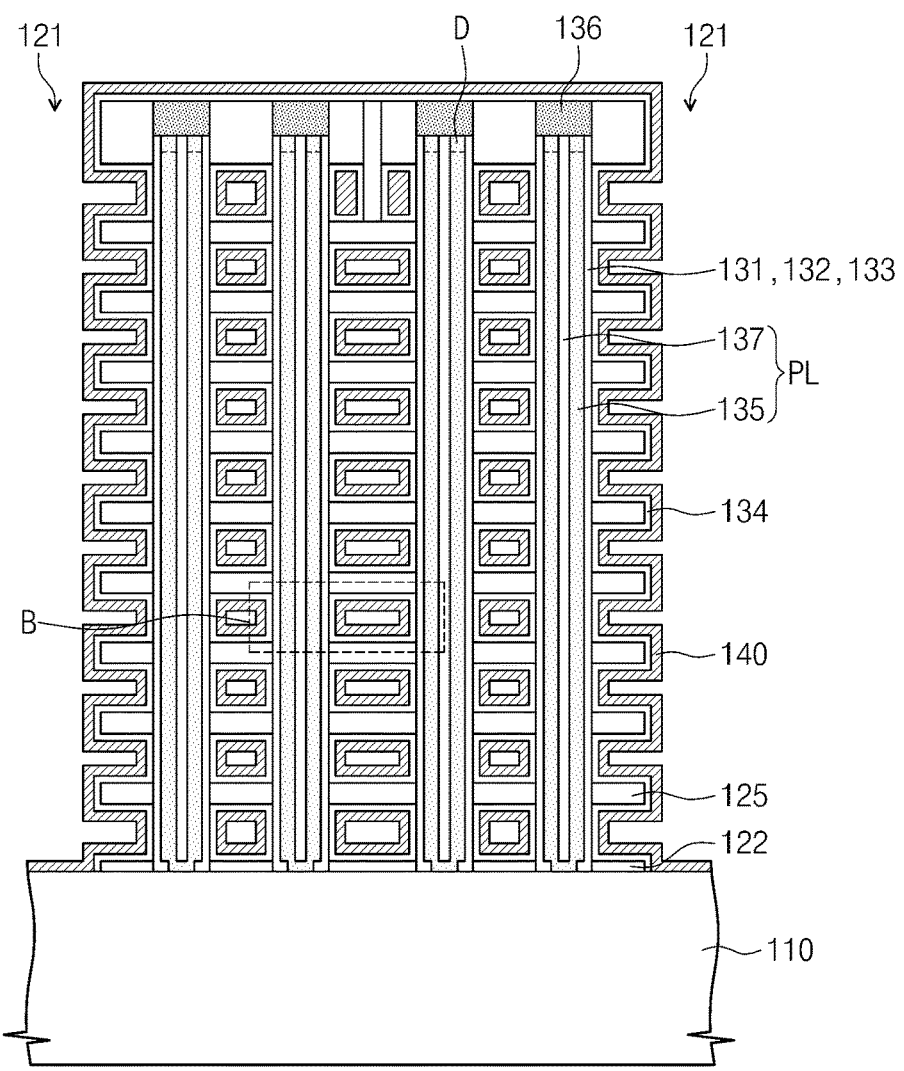
Figure 13C:
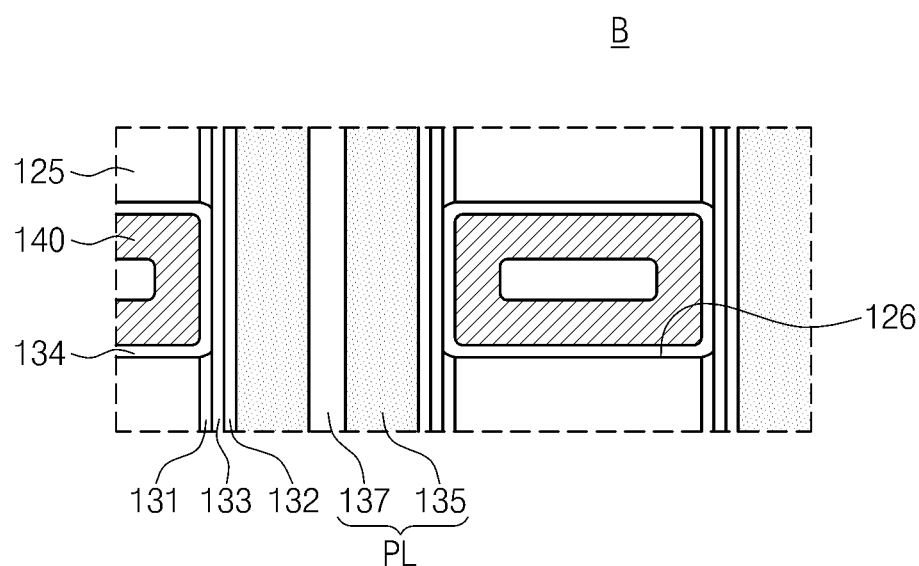
Figure 14A:
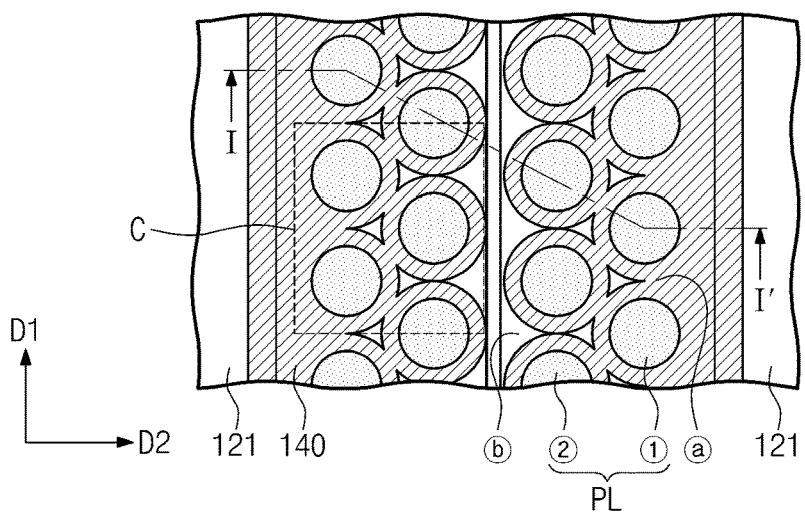
Figure 14B:
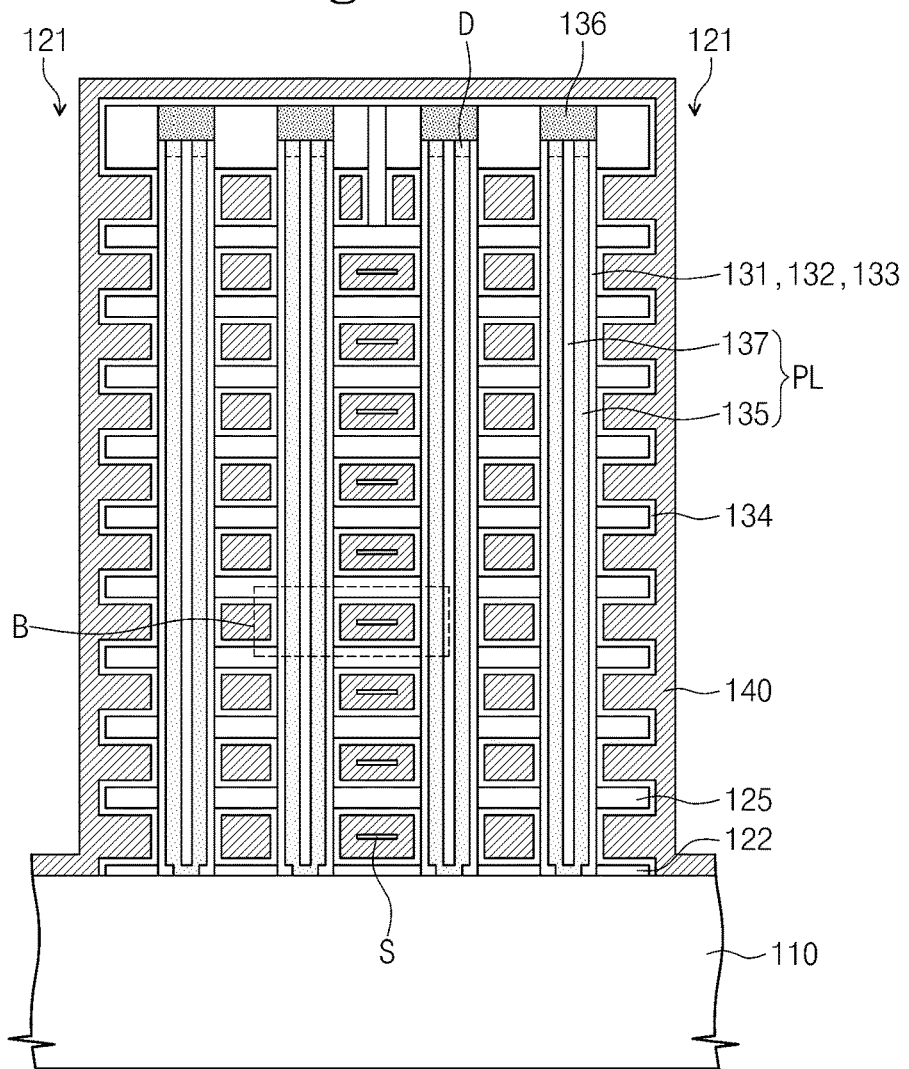
Figure 14C:
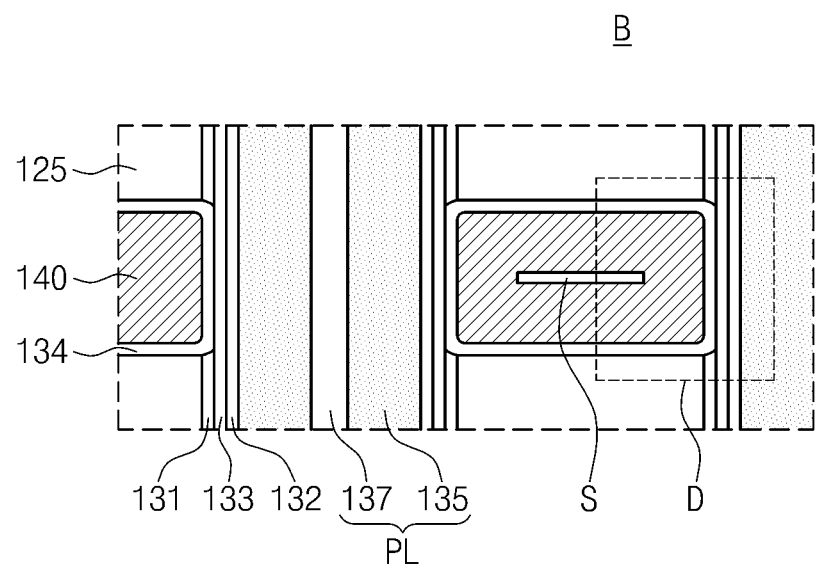

Referring to FIGS. 13A to 13C, a blocking insulating layer 134 may be formed in the recess regions 126. The blocking insulating layer 134 may be conformally formed on a top surface and a bottom surface of the insulating patterns 125 and on portions of the charge storage layer 133 that are exposed in the recess region 126. The blocking insulating layer 134 may include a high-k dielectric layer (e.g., an aluminum oxide layer or a hafnium oxide layer). The blocking insulating layer 134 may be formed of a plurality of thin layers. For example, the blocking insulating layer 134 may include an aluminum oxide layer and a silicon oxide layer, and a stack order and number of the aluminum oxide layers and a silicon oxide layers may be variously modified. The blocking insulating layer 134 may be formed by an ALD method and/or a CVD method that have an excellent step coverage property.

Referring to FIGS. 13A to 13C, 14A to 14C, 15A and 15B, a conductive layer 140 is formed on the blocking insulating layer 134. The conductive layer 140 may include at least one of a doped silicon layer, a metal layer, a metal nitride layer, and a metal silicide layer. The conductive layer 140 may be formed by a CVD method or an ALD method. In some embodiments, the conductive layer 140 may include a barrier layer 142 and a metal layer 144 disposed on the barrier layer 142. The barrier layer 142 may include a metal nitride layer (e.g., a titanium nitride layer). For example, the metal layer 144 may include a tungsten layer. In other embodiments, the conductive layer 140 may include a poly-silicon layer and a silicide layer on the poly-silicon layer. In this case, forming the conductive layer 140 may include forming a poly-silicon layer, removing a portion of the poly-silicon layer adjacent to the isolation region 121 to recess the poly-silicon layer, forming a metal layer on the recessed poly-silicon layer, thermally treating the metal layer, and removing an unreacted metal layer. The metal layer for the formation of the silicide layer may include tungsten, titanium, cobalt, or nickel.

The process of filling the recess region 126 with the conductive layer 140 will be described in more detail. The conductive layer 140 is provided from the isolation region 121 into the recess region 126. As time passes (FIGS. 13A to 13C→FIGS. 14A to 14C), a space (a) between the cell pillars (1) nearest to the isolation region 121 may be clogged or filled with the conductive layer 140 before a space (b) between cell pillars (2) far from the isolation region 121 is completely filled with the conductive layer 140. Thus, hollow regions S may be generated within the conductive layer 140. The hollow regions S may be connected to each other to extend in one direction (e.g., the first direction D1). Thus, a vertical/horizontal thickness of the conductive layer 140 in the recess region 126 may be progressively reduced as a distance from the isolation region 121 increases.

In this case, various problems may be caused. First, resistances of word lines WL1 to WL8 formed of the conductive layer 140 may increase. In particular, the resistances of the word lines WL1 to WL8 adjacent to the cell pillars (2) far from the isolation region 121 may be very great. Therefore, a voltage or current applied to the data storage element may be varied according to a distance between the data storage element and the isolation region 121. Secondly, the insulating patterns 125, the data storage element 130 and/or the cell pillars PL may be damaged during a subsequent process by chemicals permeating into and/or confined in the hollow region S.

Referring to FIGS. 15A and 15B, the blocking insulating layer 134 may include a silicon oxide layer 134a and an aluminum oxide layer 134b. The chemicals permeating into and/or confined in the hollow region S may pass through the conductive layer 140 and then may partially dissolve the blocking insulating layer 134. (See a reference designator V.) For example, the chemicals may be a fluorine gas. The fluorine gas may be generated from a source material (e.g., $WF_6$) for the formation of the conductive layer 140. Thus, electrical characteristics between the word lines WL1 to WL8 and/or between the cell pillars PL and the word lines WL1 to WL8 may be deteriorated. Additionally, a data retention characteristic of the data storage elements 130 may be deteriorated and may be non-uniform. Reducing the size and the number of the hollow regions S and/or to remove the hollow regions S may address these issues.

A height of the recess region 126 may be increased in order to achieve the above requirements. Thus, the generation of the hollow region S can be reduced and the source material can be easily removed from the recess region 126 to the isolation region 121 during the formation of the conductive layer 140. For example, a thickness of each of the sacrificial layers 123 corresponding to the recess region 126 may be equal to or greater than 35 nm. In particular, the conductive layer 140 having a thickness of about 35 nm or more may provide a low resistance of the word lines WL1 to WL8.

Referring again to FIGS. 4A to 4C, the conductive layer 140 formed outside the recess regions 126 is removed to form horizontal electrodes in the recess regions 126, respectively. The horizontal electrodes may include a lower selection line LSL, word lines WL1 to WL8 and an upper selection line USL. Two upper selection lines USL laterally separated from each other may be included in one gate structure. The two upper selection lines USL may extend in the first direction D1.

The conductive layer 121 formed in the isolation regions 121 may be removed to expose the substrate 110. Dopant ions of the second conductivity type may be heavily implanted into the exposed substrate 110 to form common source lines CSL.

An isolation insulating layer 120 may be formed to fill the isolation regions 121. The cell pillars PL arranged in the second direction D2 may be electrically connected in common to one interconnection BL1 or BL2. (See FIG. 3) Conductivity, electric insulation and/or data retention characteristic of the word lines can be improved by the adjustment of the thickness of the word lines WL1 to WL8 and the thickness of the intergate dielectric layer 150 between the word lines WL1 to WL8 according to the inventive concepts.

FIGS. 16A to 16D are enlarged views corresponding to FIG. 4C to illustrate other embodiments of a memory block of FIG. 3.

Figure 16A:
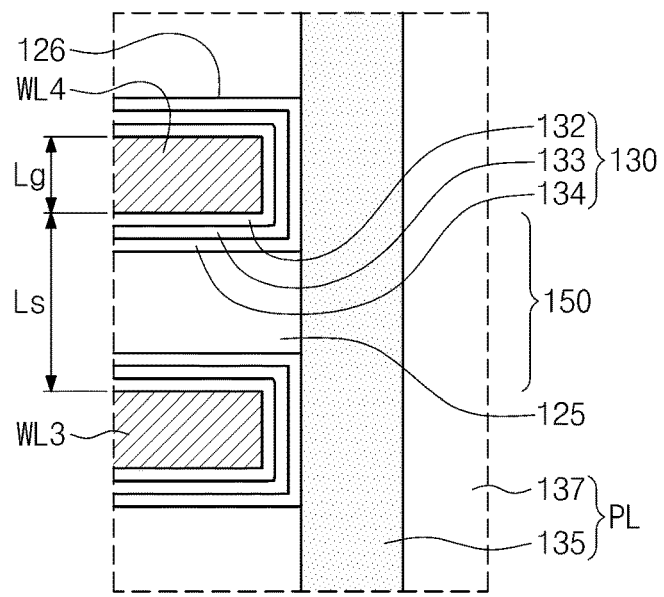
FIGS. 16A to 16D are enlarged views corresponding to FIG. 4C to illustrate other embodiments of a memory block of FIG. 3.

Referring to FIG. 16A, all of the tunnel insulating layer 132, the charge storage layer 133 and the blocking insulating layer 134 constituting the data storage element 130 may be formed in the recess region 126. In this case, the protection layer 131 may not be formed. The cell pillars PL may be formed in the cell holes H in the processes of FIGS. 7A to 7C and 8A to 8C without the formation of the protection layer 131, the charge storage layer 133 and the tunnel insulating layer 132. The cell pillars PL may be formed by depositing a semiconductor layer in the cell holes H. Thereafter, the tunnel insulating layer 132, the charge storage layer 133, and the blocking insulating layer 134 may be sequentially formed in the recess region 126 in the process of FIGS. 13A to 13C. Next, the conductive layer 140 may be formed on the blocking insulating layer 134.

In the structure described above, an intergate dielectric layer 150 includes the tunnel insulating layer 132, the charge storage layer 133, the blocking insulating layer 134, and one of the insulating patterns 125. In this example, a thickness Ls of the intergate dielectric layer 150 is equal to a sum of the thicknesses of a pair of data storage elements 130 and one of the insulating patterns 125.

Figure 16B:
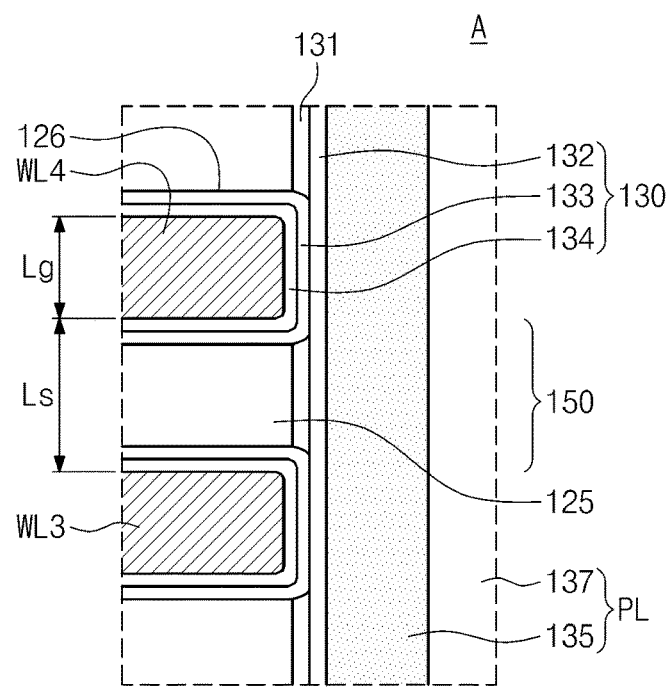

Referring to FIG. 16B, the charge storage layer 133 and the blocking insulating layer 134 may be formed in the recess region 126. In the processes of FIGS. 7A to 7C and 8A to 8C, the protection layer 131 and the tunnel insulating layer 132 may be formed in the cell holes H and then the cell pillars PL may be formed in the cell holes H. The cell pillars PL may be formed by a similar method to the processes described with reference to FIGS. 7A to 7C and 8A to 8C. Thereafter, the charge storage layer 133 and the blocking insulating layer 134 may be sequentially formed in the recess region 126 in the process of FIGS. 13A to 13C. Subsequently, the conductive layer 140 may be formed on the blocking insulating layer 134.

In this structure, an intergate dielectric layer 150 includes the charge storage layer 133, the blocking insulating layer 134, and one of the insulating patterns 125. In this example, a thickness Ls of the intergate dielectric layer 150 is equal to a sum of the thicknesses of a pair of the charge storage layers 133, a pair of blocking insulating layers 134 and one of the insulating patterns 125.

Figure 16C:
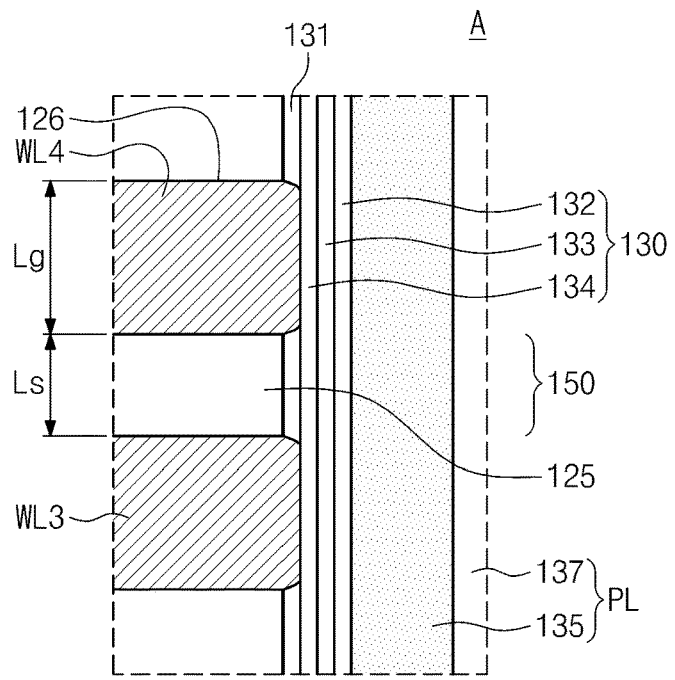

Referring to FIG. 16C, all of the tunnel insulating layer 132, the charge storage layer 133 and the blocking insulating layer 134 constituting the data storage element 130 may be formed in each of the cell holes H. The protection layer 131, the blocking insulating layer 134, the charge storage layer 133, and the tunnel insulating layer 132 are sequentially formed in the cell holes H in the processes of FIGS. 7A to 7C and 8A to 8C. The cell pillars PL may be formed on the tunnel insulating layer 132. The cell pillars PL may be formed by a similar method to the processes described with reference to FIGS. 7A to 7C and 8A to 8C. Thereafter, the conductive layer 140 may be formed in the recess region 126, such as by the process described with respect to FIGS. 13A to 13C.

In this structure, an intergate dielectric layer 150 includes one of the insulating patterns 125. A thickness Ls of the intergate dielectric layer 150 may be the same as the thickness of one of the insulating patterns 125.

Figure 16D:
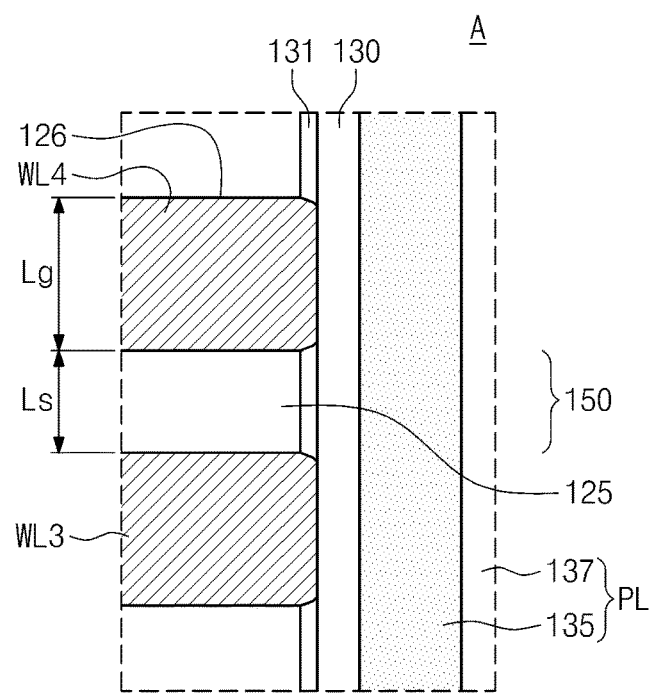

Referring to FIG. 16D, the data storage element 130 may be a variable resistance pattern. The variable resistant pattern may include one or more materials having a variable resistance property so that a resistance of the material(s) may be altered.

In some embodiments, the data storage element 130 may include a material (e.g., a phase change material) of which an electrical resistance can be changed by heat generated from a current passing through an electrode adjacent thereto. The phase change material may include at least one of antimony (Sb), tellurium (Te), and selenium (Se). For example, the phase change material may include a chalcogenide having tellurium (Te) of about 20 at % to about 80 at %, antimony (Sb) of about 5 at % to about 50 at %, and germanium (Ge). Additionally, the phase change material may further include impurities including at least one of nitrogen (N), oxygen (O), carbon (C), bismuth (Bi), indium (In), boron (B), tin (Sn), silicon (Si), titanium (Ti), aluminum (Al), nickel (Ni), iron (Fe), dysprosium (Dy), and lanthanum (La). The variable resistance pattern may be formed of one of GeBiTe, InSb, GeSb, and GaSb.

In other embodiments, the data storage element 130 may include a thin layer structure of which an electrical resistance can be changed using spin torque transfer of a current passing through the thin layer structure. The data storage element 130 may have the thin layer structure configured to exhibit a magnetoresistance property. The data storage element 130 may include at least one ferromagnetic material and/or at least one anti-ferromagnetic material.

In still other embodiments, the data storage element 130 may include at least one of perovskite compounds or transition metal oxides. For example, the data storage element 130 may include at least one of niobium oxide, titanium oxide, nickel oxide, zirconium oxide, vanadium oxide, (Pr, Ca)MnO$_3$ (PCMO), strontium-titanium oxide, barium-strontium-titanium oxide, strontium-zirconium oxide, barium-zirconium oxide, or barium-strontium-zirconium oxide.

In the event that the data storage element 130 is the variable resistance pattern, the cell pillars PL may be conductive pillars. The cell pillars PL may be formed of a conductive material. For example, the conductive material may include at least one of a doped semiconductor, a metal, a conductive metal nitride, a silicide, or a nano-structure (e.g., carbon nanotube or graphene).

In order to realize the structure of FIG. 16D, the protection layer 131 and the data storage element 130 are sequentially formed in the cell holes H in the processes of FIGS. 7A to 7C and 8A to 8C. The cell pillars PL may be formed on the data storage element 130. The cell pillars PL may be formed using a deposition process of a conductive material. Thereafter, the conductive layer 140 may be formed in the recess region 126 in the process of FIGS. 13A to 13C.

In this structure, the intergate dielectric layer 150 includes one of the insulating patterns 125. The thickness Ls of the integrate dielectric layer 150 in this example corresponds to the thickness of one of the insulating patterns 125.

Figure 17:
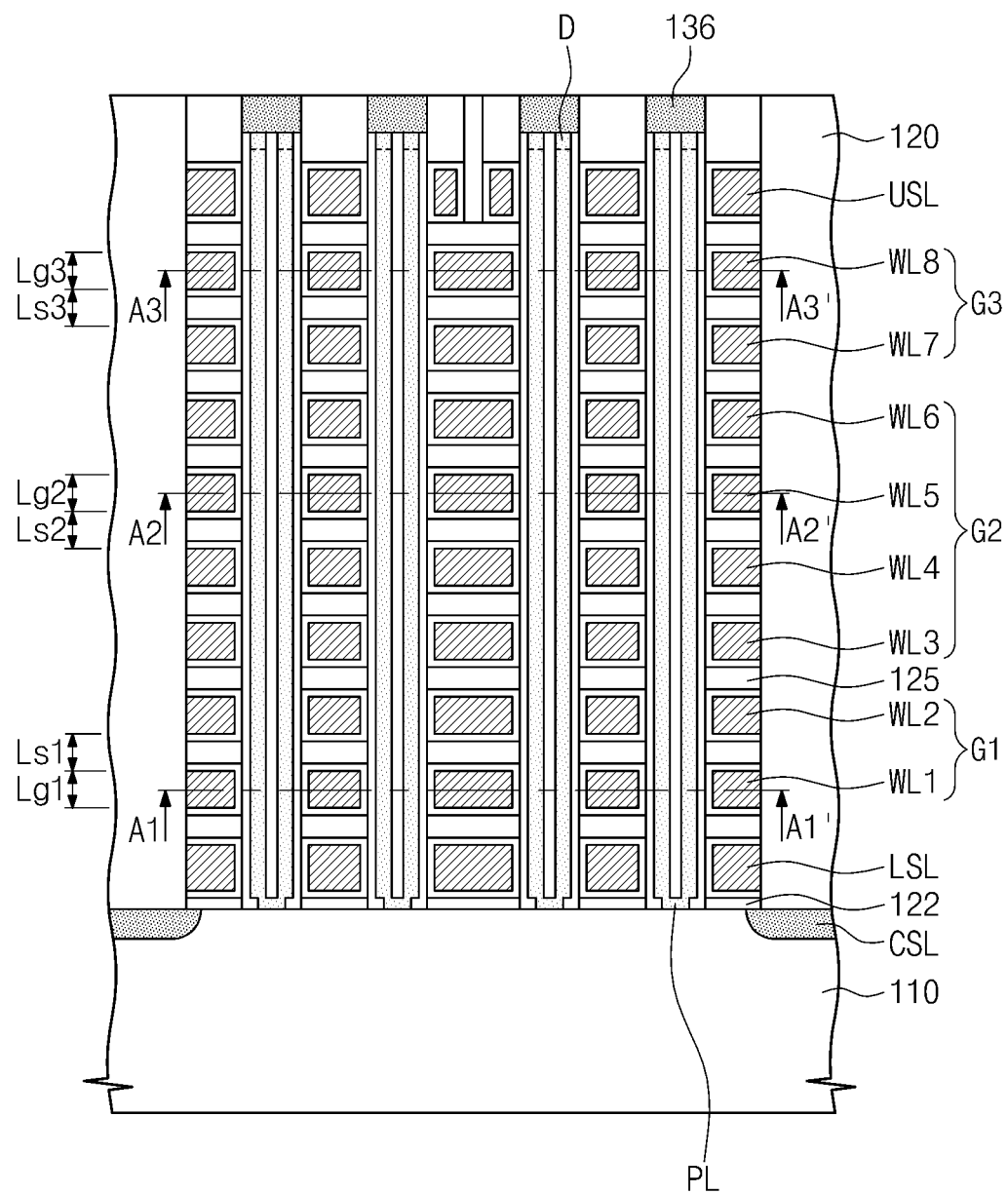
FIG. 17 is a cross-sectional view illustrating an example embodiment of a memory block of FIG. 3.

FIG. 17 is a cross-sectional view illustrating an example embodiment of a memory block of FIG. 3. Referring to FIG. 17, the word lines WL1 to WL8 may include a first group G1 near to the substrate 110, a third group G3 far from the substrate 110, and a second group G2 between the first group G1 and the third group G3. The first group G1, the second group G2, and the third group G3 may correspond to one or more lower word lines, one or more middle word lines, and one or more upper word lines, respectively. The memory cells of each of the vertical strings may include one or more lower memory cells, one or more middle memory cells, and one or more upper memory cells. A ratio of the thickness of each word line to the space between the word lines (i.e., the thickness of the intergate dielectric layer 150) in at least one group may be different from those in other groups. For example, the ratio (Lg/Ls) of the thickness of each word line to the space between the word lines of one group (e.g., second group G2) may be at least 10% larger than, at least 20% larger than or at least 40% larger than the ratio (Lg/Ls) of the thickness of each word line to the space between the word lines of another group or other groups (e.g., the first group G1 and/or third group G3). A larger Lg/Ls ratio may be helpful at locations of cell pillars having a larger diameter. This larger ratio Lg/Ls may be 1.3 or larger in some examples. In the example above, the portion of the cell pillar at the one group (e.g., group G2) may have a larger diameter than portions of the cell pillar at the other group(s) (e.g., the first group G1 and/or third group G3). In other examples, the ratio (Lg/Ls) of the thickness of each word line to the space between the word lines of one group (e.g., second group G2) may be at least 10% smaller than, at least 20% smaller than or at least 40% smaller than the ratio (Lg/Ls) of the thickness of each word line to the space between the word lines of another group or other groups (e.g., the first group G1 and/or third group G3). A smaller Lg/Ls ratio may be helpful at locations of cell pillars having a more striation. This smaller Lg/Ls ratio may be 1.3 or lower, in some examples. In this latter example, the portion of the cell pillar at the one group (e.g., group G2) may have a smaller diameter than portions of the cell pillar at the other group(s) (e.g., the first group G1 and/or third group G3). The different Lg/Ls ratios described herein may be obtained by providing different thicknesses of one or both of Lg and Ls, such as differing word line thicknesses Lg of appropriate groups (as described with respect to the embodiments herein) by more than 10%, more than 20% or more than 40%, or by differing spacing Ls between word lines of appropriate groups (as described with respect to the embodiments herein) by more than 10%, or more than 20% or more than 40%.

Figure 18A:
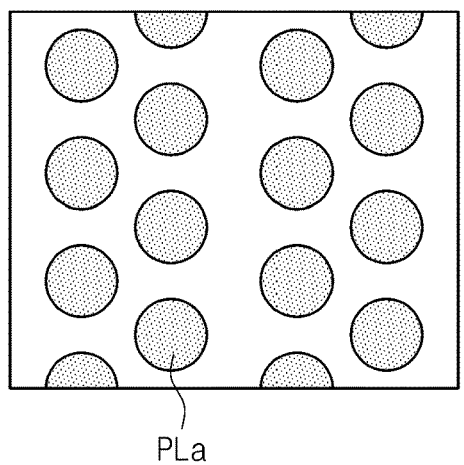
FIGS. 18A to 18C are plan views taken along lines A1-A1', A2-A2', and A3-A3' of FIG. 17, respectively.
Figure 18B:
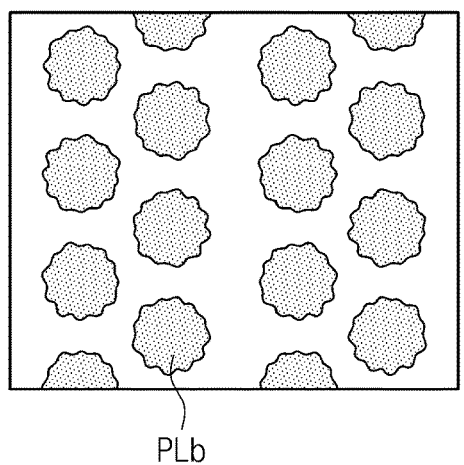
Figure 18C:
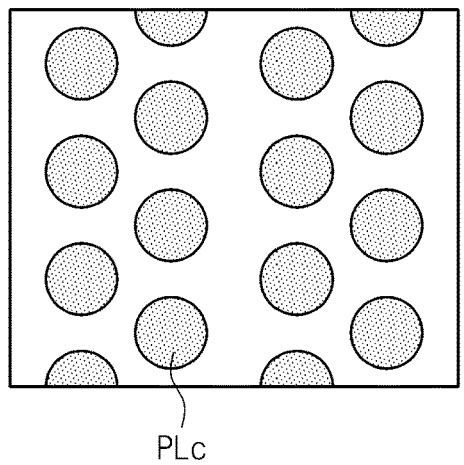

FIGS. 18A to 18C are plan views taken along lines A1-A1', A2-A2', and A3-A3' of FIG. 17, respectively, according to one exemplary embodiment. For the purpose of convenience and simplicity in the drawings, only cell pillars PL are illustrated in FIGS. 18A to 18C. The plan views taken along the lines A1-A1', A2-A2', and A3-A3' correspond to the first group G1, the second group G2, and the third group G3, respectively. Each of the cell pillars PL may be classified into a lower portion PLa, a middle portion PLb, and an upper portion PLc according to a height of the cell pillar PL, corresponding to the groups.

Referring to FIGS. 18A to 18C, striation may be generated on circumferences of the cell pillars in a specific group. Cell pillars may have non-uniform diameters at corresponding striated locations. The striation may be caused by non-uniformity in a reaction of an etching gas and the sacrificial layers/insulating layers and in a reaction of the etching gas and a reaction byproduct. The striation may be generated more at positions of the cell holes H corresponding to, for example, the second group G2. Thus, the striation of the middle portion PLb may be greater than those of the lower portion PLa and the upper portion PLc. Cell pillars at their striated locations may have a larger surface area (or larger distance around their circumference) than that of cell pillars at their non striated locations (or with less striation). For example, striation differences of any of the embodiments described herein may result in a circumferential lengths of the corresponding portions of the cell pillars differing by more than 5% or more than 10%.

Figure 19A:
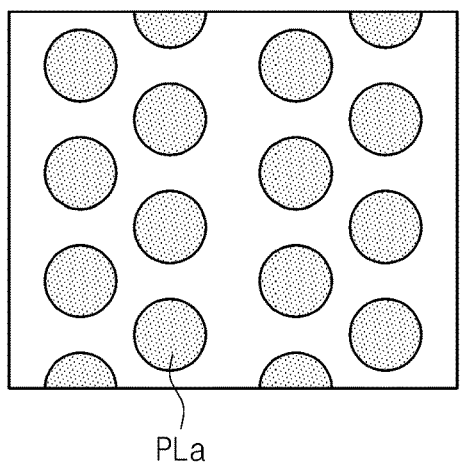
FIGS. 19A to 19C are plan views taken along lines A1-A1', A2-A2', and A3-A3' of FIG. 17, respectively.
Figure 19B:
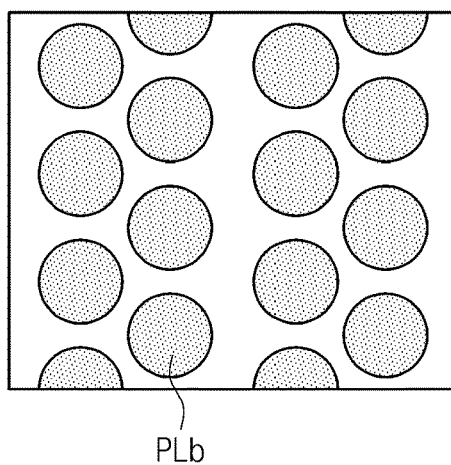
Figure 19C:
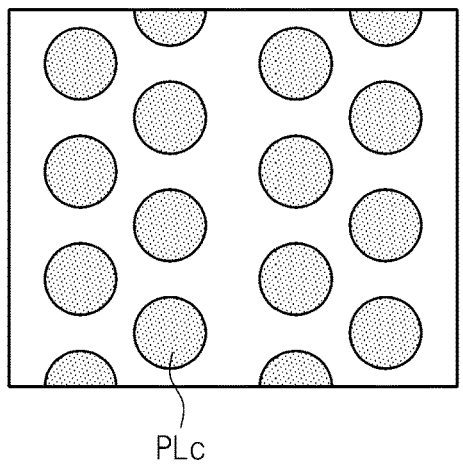

FIGS. 19A to 19C are plan views taken along lines A1-A1', A2-A2', and A3-A3' of FIG. 17, respectively, according to another exemplary embodiment. For the purpose of convenience and simplicity in the drawings, only cell pillars PL are illustrated in FIGS. 19A to 19C. Referring to FIGS. 19A to 19C, sizes of the cell holes H at a height of a specific group may be different from those of other groups. For example, a bowing phenomenon may occur in the cell holes H at the height of the second group G2. Thus, a diameter of the middle portion PLb may be greater than those of the lower portion PLa and the upper portion PLc. For example, diameters of portions of the cell pillar may differ by more than 10% or by more than 20%. For example, the diameters of the middle portion PLb may be greater than 10% or greater than 20% than the diameters of the lower portion PLa and/or the upper portion PLc.

The striation and the bowing may cause non-uniformity of the cell pillars PL according to the groups, so that a dispersion of cell characteristics may be increased.

The ratio (Lg/Ls) of the thickness Lg of the word line to the space Ls between the word lines (i.e., the thickness Ls of the intergate dielectric layer 150) of at least one group may be different from those of other groups. Differing the ratio Lg/Ls may address a non-uniformity of cell characteristics that may otherwise occur or occur to a larger extent. For example, striation and/or the bowing occur in the second group G2 may be addressed by providing a ratio (Lg2/Ls2) of the second group G2 to be different from ratios (Lg1/Ls2 and Lg3/Ls3) of the first and third groups G1 and G3.

In some embodiments, if the bowing occurs, diameters of the cell holes H may be relatively increased such that a distance between the cell pillars PL may be reduced. This phenomenon may cause make the replacement process of the conductive layer described with reference to FIGS. 13A to 13C and 14A and 14C more difficult. For example, occurrence of the aforementioned hollow region S and damage of the blocking insulating layer may result. These problems can be improved by increasing a thickness of the recess region 126 (i.e., the thickness of the sacrificial layer) corresponding to the thickness of the word lines WL1 to WL8 of the group in which the bowing phenomenon occurs. In other words, the occurrence of the hollow region S can be inhibited or reduced to reduce the damage of the blocking insulating layer. Thus, the ratio (Lg/Ls) of the group in which the bowing phenomenon occurs may be increased.

In other embodiments, if the striation is generated, electrical interference between cells disposed at different heights may be increased. This problem can be addressed by increasing the space Ls between the word lines (i.e., the thickness Ls of the intergate dielectric layer 150) in the group in which the striation is generated. Thus, the ratio (Lg/Ls) of the group in which the striation is generated may be reduced.

In still other embodiments, a program speed of a specific group may be different from those of other groups. Likewise, threshold voltages Vth of cells of a specific group may be different from those of other groups. In these cases, the ratio (Lg/Ls) described above may be adjusted. For example, if the program speed of a specific group is faster than those of other groups, the space Ls between the word lines (i.e., the thickness Ls of the intergate dielectric layer 150) in the specific group may be made relatively smaller. Thus, the interference between the word lines in the specific group may be increased to reduce the program speed of the specific group. As a result, the program speeds of all groups can be substantially uniform. In this case, the ratio (Lg/Ls) of the specific group may be less than those of other groups.

As described above, the thicknesses Lg of the word lines WL1 to WL8 and/or the spaces Ls between the word lines WL1 to WL8 may be nonmonotonically varied along the cell pillar PL as a height from the substrate 110 increases. For example, the thickness Lg of the word line may be relatively larger at locations where the diameters of the cell pillars PL are relatively large. For example, the space Ls between the word lines may be relatively larger at the locations where the non-uniformity of the diameters of the cell pillars PL is relatively large.

Figure 20:
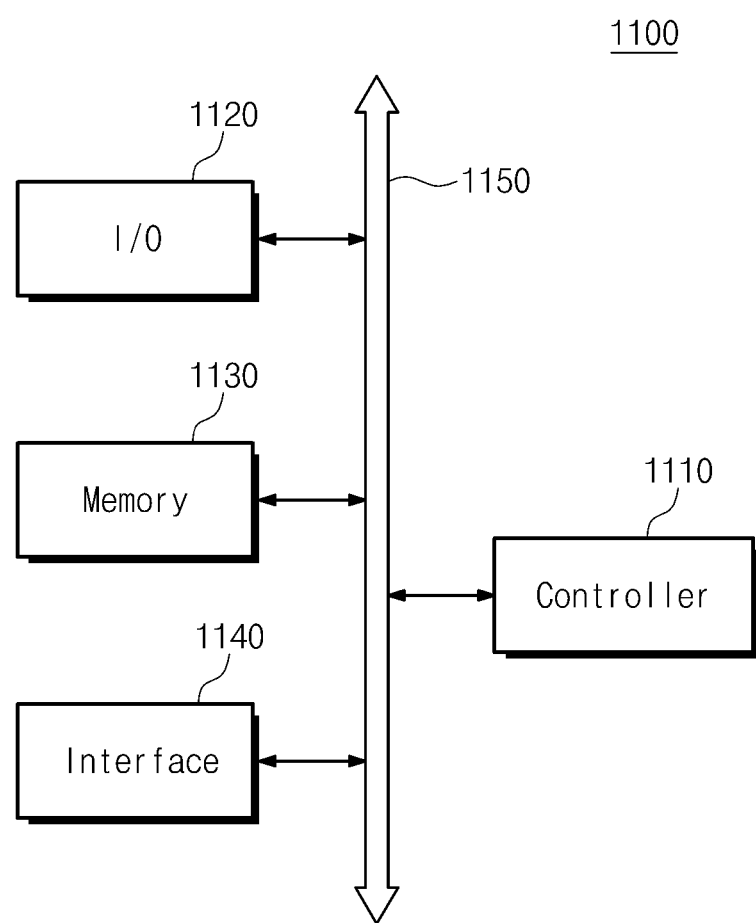
FIG. 20 is a schematic block diagram illustrating an example of an electronic system including a semiconductor device according to embodiments of the inventive concepts.

FIG. 20 is a schematic block diagram illustrating an example of an electronic system including a semiconductor device according to embodiments of the inventive concepts.

Referring to FIG. 20, an electronic system 1100 according to embodiments of the inventive concept may include a controller 1110, an input/output (I/O) unit 1120, a memory device 1130, an interface unit 1140 and a data bus 1150. At least two of the controller 1110, the I/O unit 1120, the memory device 1130 and the interface unit 1140 may be coupled to each other through the data bus 1150. The data bus 1150 may correspond to a path through which data are transmitted. The memory device 1130 may include at least one of the semiconductor devices according to embodiments of the inventive concepts.

The controller 1110 may include at least one of a microprocessor, a digital signal processor, a microcontroller, or other logic devices having a similar function to any one thereof. The I/O unit 1120 may include a keypad, a keyboard and/or a display unit. The memory device 1130 may store data and/or commands. The interface unit 1140 may transmit electrical data to a communication network or may receive electrical data from a communication network. The interface unit 1140 may operate by wireless or cable. For example, the interface unit 1140 may include an antenna for wireless communication or a transceiver for cable communication. Although not shown in the drawings, the electronic system 1100 may further include a fast dynamic random access memory (DRAM) device and/or a fast static random access memory (SRAM) device that acts as a cache memory for improving an operation of the controller 1110.

The electronic system 1100 may be applied to a personal digital assistant (PDA), a portable computer, a web tablet, a wireless phone, a mobile phone, a digital music player, a memory card or other electronic products. The other electronic products may receive or transmit information data by wireless.

Figure 21:
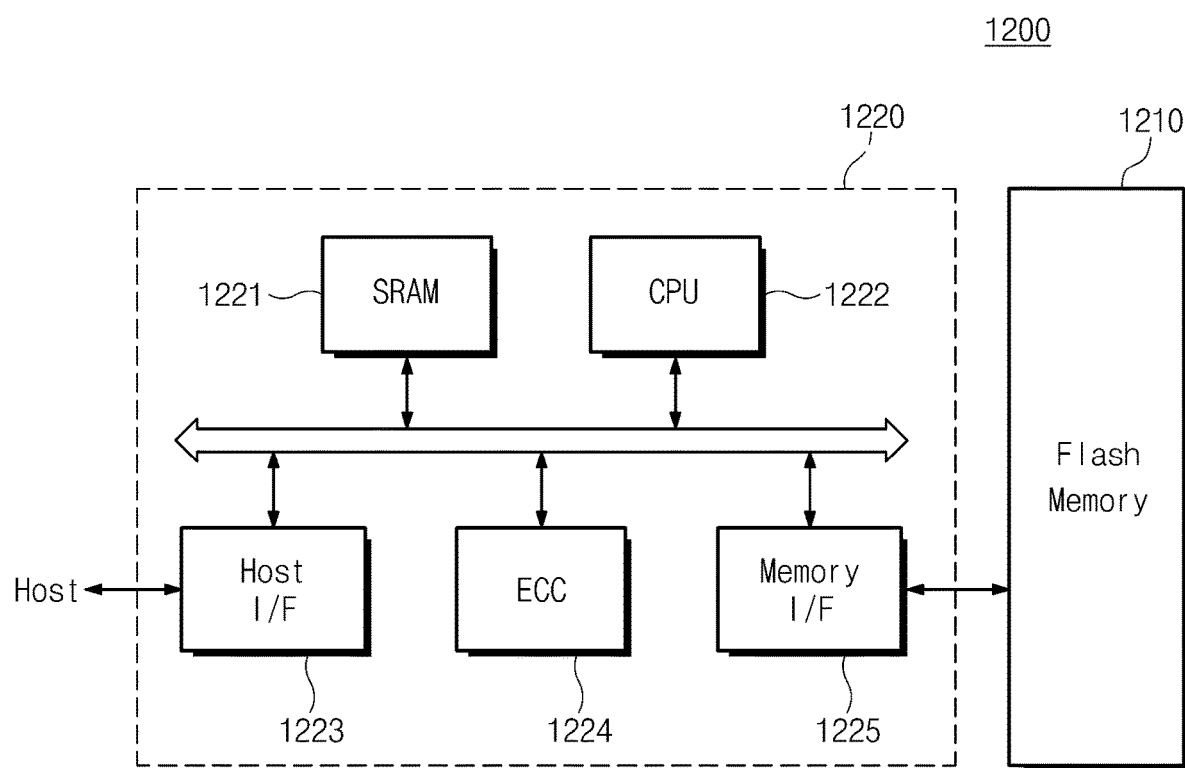
FIG. 21 is a schematic block diagram illustrating an example of a memory system including a semiconductor device according to embodiments of the inventive concepts.

FIG. 21 is a schematic block diagram illustrating an example of a memory system including a semiconductor device according to embodiments of the inventive concepts.

Referring to FIG. 21, a memory system 1200 includes a memory device 1210. The memory device 1210 may include at least one of the semiconductor devices according to the aforementioned embodiments. Additionally, the memory device 1210 may further include other types of semiconductor memory devices (e.g., a DRAM device and/or a SRAM device). The memory system 1200 may include a memory controller 1220 that controls data communication between a host and the memory device 1210. The memory device 1210 may include at least one of semiconductor devices according to embodiments of the inventive concepts.

The memory controller 1220 may include a central processing unit (CPU) 1222 that controls overall operations of the memory card 1200. In addition, the memory controller 1220 may include an SRAM device 1221 used as an operation memory of the CPU 1222. Moreover, the memory controller 1220 may further include a host interface unit 1223 and a memory interface unit 1225. The host interface unit 1223 may be configured to include a data communication protocol between the memory system 1200 and the host. The memory interface unit 1225 may connect the memory controller 1220 to the memory device 1210. Furthermore, the memory controller 1220 may further include an error check and correction (ECC) block 1224. The ECC block 1224 may detect and correct errors of data that are read out from the memory device 1210. Even though not shown in the drawings, the memory system 1200 may further include a read only memory (ROM) device that stores code data to interface with the host. The memory system 1200 may be used as a portable data storage card. Alternatively, the memory system 1200 may realized as solid state disks (SSD) that are used as hard disks of computer systems.

Figure 22:
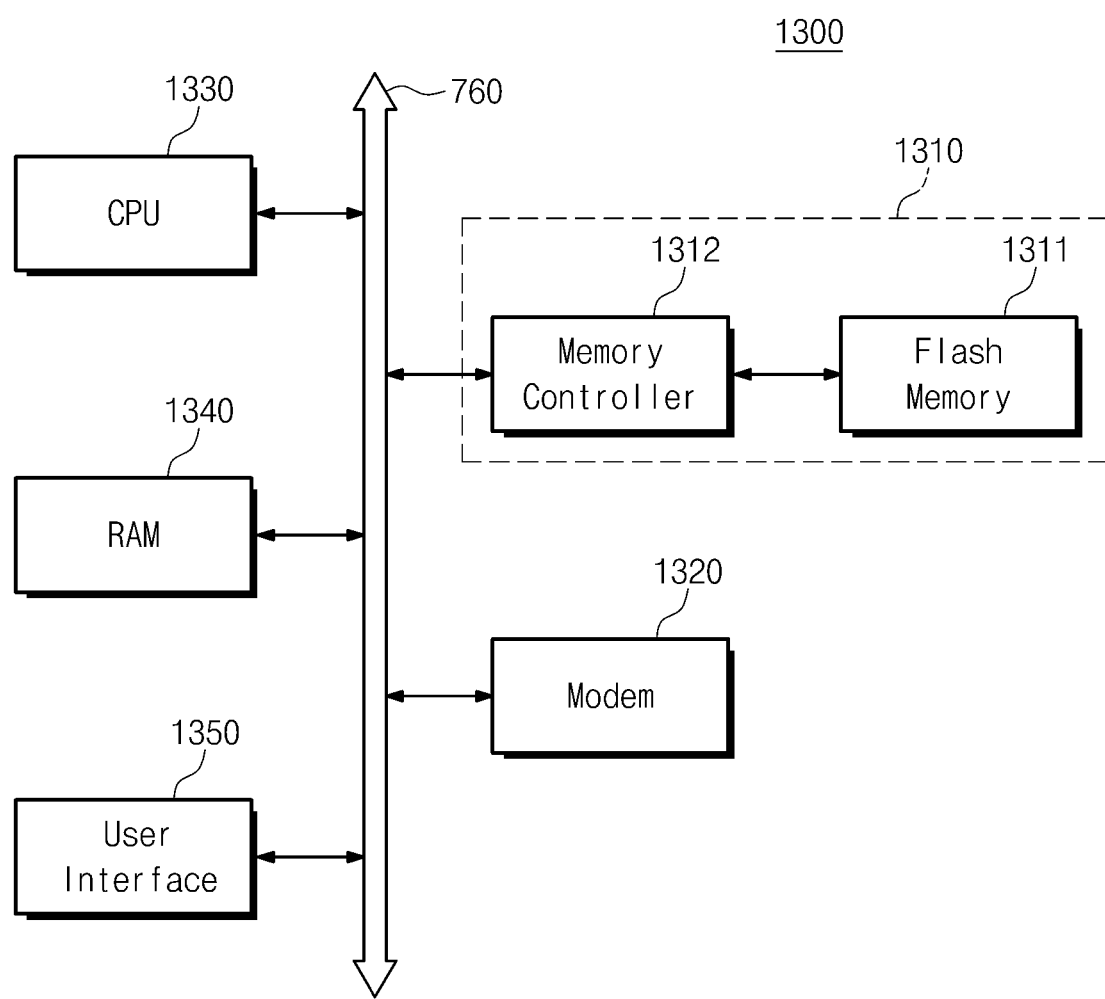
FIG. 22 is a schematic block diagram illustrating an example of an information processing system including a semiconductor device according to embodiments of the inventive concepts.

FIG. 22 is a schematic block diagram illustrating an example of an information processing system including a semiconductor device according to embodiments of the inventive concepts.

Referring to FIG. 22, a flash memory system 1310 according to embodiments of the inventive concepts may be installed in an information processing system such as a mobile device or a desk top computer. The information processing system 1300 according to embodiments of the inventive concepts may include a modem 1320, a central processing unit (CPU) 1330, a random access memory (RAM) 1340, and a user interface unit 1350 that are electrically connected to the memory system 1310 through a system bus 760. The flash memory system 1310 may be substantially the same as the aforementioned memory system. The flash memory system 1310 may store data processed by the CPU 1330 or data inputted from the outside of the information processing system 1300. Here, the flash memory system 1310 may be realized as a solid state disk (SSD). In this case, the information processing system 1300 may be able to reliably store massive data in the memory system 1310. This increase in reliability enables the memory system 1310 to conserve resources for error correction such that a high speed data exchange function may be provided to the information processing system 1300. Although not shown in the drawings, the information processing system 1300 may further include an application chipset, a camera image processor (CIS), and/or an input/output device.

Additionally, the semiconductor devices and the memory systems according to embodiments of the inventive concepts may be encapsulated using various packaging techniques. For example, the flash memory devices and the memory systems according to the aforementioned embodiments may be encapsulated using any one of a package on package (POP) technique, a ball grid arrays (BGAs) technique, a chip scale packages (CSPs) technique, a plastic leaded chip carrier (PLCC) technique, a plastic dual in-line package (PDIP) technique, a die in waffle pack technique, a die in wafer form technique, a chip on board (COB) technique, a ceramic dual in-line package (CERDIP) technique, a plastic metric quad flat package (PMQFP) technique, a plastic quad flat package (PQFP) technique, a small outline package (SOIC) technique, a shrink small outline package (SSOP) technique, a thin small outline package (TSOP) technique, a thin quad flat package (TQFP) technique, a system in package (SIP) technique, a multi-chip package (MCP) technique, a wafer-level fabricated package (WFP) technique and a wafer-level processed stack package (WSP) technique.

According to embodiments of the inventive concepts, the thicknesses of the word lines and/or the spaces between the word lines may be suitably varied to improve the uniformity and reliability of the vertical memory cells.

While the inventive concepts have been described with reference to example embodiments, it will be apparent to those skilled in the art that various changes and modifications may be made without departing from the spirits and scopes of the inventive concepts. Therefore, it should be understood that the above embodiments are not limiting, but illustrative. Thus, the scopes of the inventive concepts are to be determined by the broadest permissible interpretation of the following claims and their equivalents, and shall not be restricted or limited by the foregoing description.

What is claimed is:

1. A semiconductor device comprising:
a substrate;
a stack comprising a plurality of electrodes and a plurality of insulating layers vertically and alternately stacked on the substrate, the stack including a first portion, a second portion, and a third portion which are sequentially stacked in a vertical direction with respect to the substrate, the plurality of insulating layers including a first insulating layer, a second insulating layer and a third insulating layer;
a plurality of cell pillars vertically extending through the stack, each of the cell pillars continuously extending through the stack from the uppermost one of the electrodes to the lowermost one of the electrodes
wherein the first portion of the stack includes the first insulating layer, the first insulating layer having a first thickness and disposed between two immediately adjacent ones of the electrodes of the first portion of the stack,
wherein the second portion of the stack includes the second insulating layer, the second insulating layer having a second thickness different from the first thickness and disposed between two immediately adjacent ones of the electrodes of the second portion of the stack, and
wherein the third portion of the stack includes the third insulating layer, the third insulating layer having a third thickness different from the second thickness and disposed between two immediately adjacent ones of the electrodes of the third portion of the stack.

2. The semiconductor device of claim 1, wherein the first thickness is different from the third thickness.

3. The semiconductor device of claim 1,
wherein the two immediately adjacent ones of the electrodes of the first portion of the stack includes a first electrode immediately adjacent to the first insulating layer,
wherein two immediately adjacent ones of the electrodes of the second portion of the stack includes a second electrode immediately adjacent to the second insulating layer, and wherein a ratio of the first thickness to a thickness of the first electrode is different from a ratio of the second thickness to a thickness of the second electrode.

4. The semiconductor device of claim 3,
wherein the two immediately adjacent ones of the electrodes of the third portion of the stack includes a third electrode immediately adjacent to the third insulating layer, and
wherein a ratio of the second thickness to a thickness of the second electrode is different from a ratio of the third thickness to a thickness of the third electrode.

5. The semiconductor device of claim 1, wherein at least one of the first, second, and third insulating layers is thinner than the corresponding electrode immediately adjacent to the one of the first, second, and third insulating layers.

6. The semiconductor device of claim 1, wherein the first thickness and the third thickness are greater than the second thickness.

7. The semiconductor device of claim 1, wherein the third thickness and the first thickness are less than the second thickness.

8. The semiconductor device of claim 1, wherein the plurality of electrodes comprising a lower select line, an upper select line, and a plurality of word lines disposed between the lower select line and the upper select line,
wherein the first portion of the stack includes the lower select line and a first one of the word lines.

9. The semiconductor device of claim 8, wherein the third portion of the stack includes the upper select line and a second one of the word lines.

10. The semiconductor device of claim 1, wherein a diameter of a first cell pillar of the plurality of cell pillars within the first portion of the stack is smaller than a diameter of the first cell pillar within the second portion of the stack.

11. The semiconductor device of claim 1, further comprising a plurality of pillar insulation layers, each pillar insulation layer surrounding a corresponding cell pillar and vertically and continuously extending through and from the uppermost electrode of the plurality of electrodes to and through the lowermost electrode of the plurality of electrodes with respect to a vertical cross section through the corresponding cell pillar.

12. The semiconductor device of claim 11, wherein the pillar insulation layers are tunnel insulating layers and the semiconductor device further comprises:
a plurality of charge storage layers between the tunnel insulating layers and the plurality of electrodes; and
a plurality of blocking insulating layers between the charge storage layers and the plurality of electrodes.

13. A semiconductor device comprising:
a substrate;
a stack comprising a plurality of electrodes and insulating layers vertically and alternately stacked on the substrate, the stack including a first portion, a second portion, and a third portion which are sequentially stacked in a vertical direction with respect to the substrate;
a plurality of cell pillars vertically extending through the stack,
wherein the first portion of the stack includes a first electrode of the electrodes and a first insulating layer of the insulating layers, the first insulating layer being immediately adjacent to the first electrode,
wherein the second portion of the stack includes a second electrode of the electrodes and a second insulating layer of the insulating layers, the second insulating layer being immediately adjacent to the second electrode, wherein the third portion of the stack includes a third electrode of the electrodes and a third insulating layer of the insulating layers, the third insulating layer being immediately adjacent to the third electrode, wherein a ratio of a thickness of the first electrode to a thickness of the first insulating layer is different than a ratio of a thickness of the second electrode to a thickness of the second insulating layer, and wherein a ratio of a thickness of the third electrode to a thickness of the third insulating layer is different than the ratio of the thickness of the second electrode to the thickness of the second insulating layer.

14. The semiconductor device of claim 13, wherein the ratio of the thickness of the second electrode to the thickness of the second insulating layer is greater than the ratio of the thickness of the first electrode to the thickness of the first insulating layer.

15. The semiconductor device of claim 13, wherein the ratio of the thickness of the second electrode to the thickness of the second insulating layer is less than the ratio of the thickness of the first electrode to the thickness of the first insulating layer.

16. The semiconductor device of claim 15, wherein the thickness of the first electrode is different from the thickness of the first insulating layer, wherein the thickness of the second electrode is different from the thickness of the second insulating layer, and wherein the thickness of the third electrode is different from the thickness of the third insulating layer.

17. The semiconductor device of claim 13, wherein the plurality of electrodes comprising a lower select line, an upper select line, and a plurality of word lines disposed between the lower select line and the upper select line, and wherein the first portion of the stack includes the lower select line and a first one of the word lines.

18. The semiconductor device of claim 17, wherein the third portion of the stack includes the upper select line and a second one of the word lines.

19. The semiconductor device of claim 13, further comprising a plurality of pillar insulation layers, each pillar insulation layer surrounding a corresponding cell pillar and vertically and continuously extending through and from the uppermost electrode of the plurality of electrodes to and through the lowermost electrode of the plurality of electrodes with respect to a vertical cross section through the corresponding cell pillar.

20. The semiconductor device of claim 19, wherein the pillar insulation layers are tunnel insulating layers and the semiconductor device further comprises:

a plurality of charge storage layers between the tunnel insulating layers and the plurality of electrodes; and a plurality of blocking insulating layers between the charge storage layers and the plurality of electrodes.

\* \* \* \* \*